(12) United States Patent  (10) Patent No.: US 6,707,176 B1
Rodgers  (45) Date of Patent: Mar. 16, 2004

(54) NON-LINEAR ACTUATOR SUSPENSION FOR MICROELECTROMECHANICAL SYSTEMS

(75) Inventor: Murray Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/099,892

(22) Filed: Mar. 14, 2002

(51) Int. Cl.[7] ............................................... H02N 1/00
(52) U.S. Cl. ............................. 310/40 MM; 310/309
(58) Field of Search ............................. 310/308–309, 310/40 MM, DIG. 6

(56) References Cited

U.S. PATENT DOCUMENTS

| | | | | |
|---|---|---|---|---|
| 5,025,346 A | * | 6/1991 | Tang et al. | 361/283.1 |
| 5,992,233 A | * | 11/1999 | Clark | 73/514.35 |
| 6,000,280 A | * | 12/1999 | Miller et al. | 73/105 |
| 6,082,208 A | | 7/2000 | Rodgers et al. | 74/406 |
| 6,133,670 A | | 10/2000 | Rodgers et al. | 310/309 |
| 6,149,190 A | * | 11/2000 | Galvin et al. | 280/735 |
| 6,250,156 B1 | * | 6/2001 | Seshia et al. | 73/504.12 |
| 6,257,739 B1 | * | 7/2001 | Sun et al. | 362/285 |
| 6,291,922 B1 | * | 9/2001 | Dhuler | 310/307 |

* cited by examiner

*Primary Examiner*—Burton Mullins
(74) *Attorney, Agent, or Firm*—Marsh Fischmann & Breyfogle LLP

(57) ABSTRACT

The present invention is generally directed to a method and assembly for supporting an actuation apparatus (e.g. a movable electrostatic comb) of a microelectromechanical (MEM) system. A suspension assembly of the present invention generally resists actuation forces inherent to electrostatically controlled MEM systems by utilizing an opposingly-directed non-linear tensile force. This can be accomplished by utilizing a suspension assembly of the invention including a longitudinal center beam and a plurality of first and second lateral beams extending out from lateral sides of the center beam. When the center beam of the suspension assembly is drawn in a first direction due to the actuation force(s), either or both of the plurality of first lateral beams and the plurality of second lateral beams are stretched to exert a non-linear tensile force having a force vector component generally oriented in a second direction generally opposite the first direction.

86 Claims, 22 Drawing Sheets

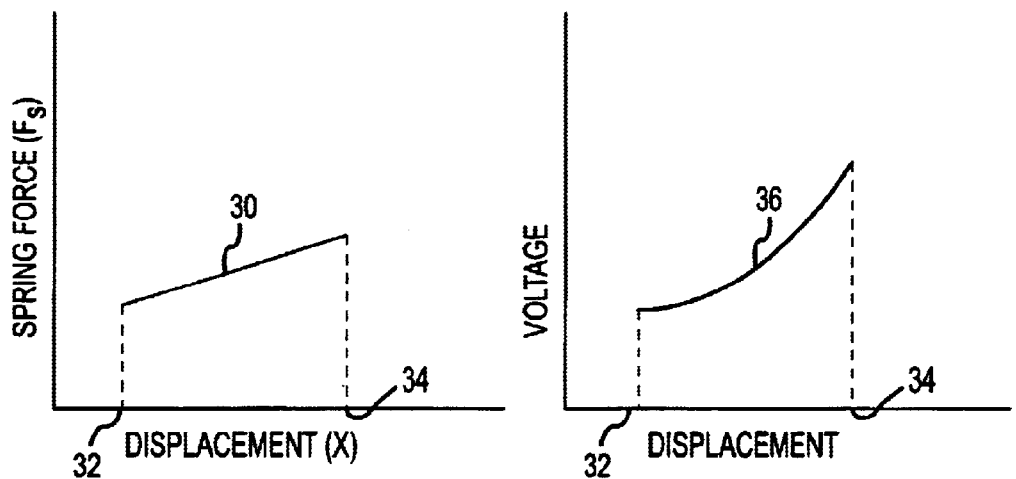
FIG.2A
PRIOR ART
FIG.2B
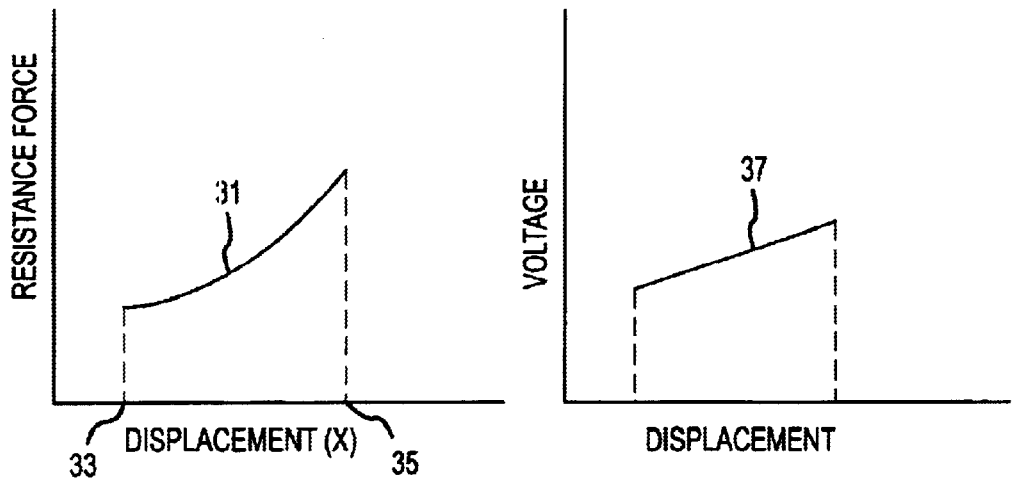
FIG.2C
FIG.2D

NON-LINEAR ACTUATOR SUSPENSION FOR MICROELECTROMECHANICAL SYSTEMS

FIELD OF THE INVENTION

The present invention generally relates to the field of microelectromechanical (MEM) systems and, more particularly, to a microelectromechanical system which includes a suspension assembly for at least assisting in supporting a movable element (such as an electrostatic comb).

BACKGROUND OF THE INVENTION

Microelectromechanical (MEM) technology generally involves the fabrication of small mechanical devices on a substrate (usually silicon). The various microstructures of a MEM system may be formed using a variety of appropriate processes. An example of such a process is a surface micromachining process that generally entails depositing alternate layers of structural material and sacrificial material on an appropriate substrate, which generally functions as a foundation for the resulting microstructure(s). Various patterning operations may be executed on one or more of these layers (usually, but not always, before the next layer is deposited) so as to define the desired microstructure(s). Generally, after at least a portion of the microstructure(s) has been defined in an appropriate manner, such as by the process described above, the various sacrificial layers (if such layers are present) may be removed by exposing the microstructure(s) and/or the various sacrificial layers to at least one etchant to "release" the resulting microstructure(s).

MEM-based systems can generally include suspension assembly microstructures that support movable elements, such as electrostatic elements of electrostatic actuators. These electrostatic actuators may have, for example, both stationary and moveable electrostatic combs, which, in combination, may function to provide power motive sources to microstructure(s) of microelectromechanical systems. In the case of a suspension assembly being utilized in an electrostatic comb actuator application, one or more moveable combs of the electrostatic comb actuator(s) generally may be attached to the suspension assembly to enable each moveable comb to move toward and/or away from its accompanying stationary comb.

However, various problems have been associated with conventional suspension assemblies. Take, for example, the case of a moveable element such as a moveable electrostatic comb associated with a conventional suspension assembly. Generally, each electrostatic comb has a base beam with a plurality of comb fingers extending therefrom. An increasing amount of voltage is typically needed to urge a moveable comb (via movement of the suspension assembly) toward a corresponding stationary comb to produce a resultant actuation (e.g., movement of a mirror in an optical switch application). More specifically, the application of voltage to, for example, the stationary comb of the actuator creates a variety of attractive forces between the moveable and stationary combs. A first of such attractive forces is a "comb force" generally defined by the change in capacitance per unit of displacement that arises between each side of each movable comb finger and sides of the stationary fingers by which it passes. Typically this attractive comb force will generally vary with respect to the square of the applied voltage. This comb force also is generally the main force that affects the positioning of the moveable comb with respect to each corresponding stationary comb in electrostatic actuator assemblies.

A second of such attractive forces is a "parallel plate force" generally defined by the attraction of each finger of the moveable comb toward adjacent stationary comb fingers disposed on each side of the moveable comb fingers. Since this parallel plate force is generally oriented in direction that is substantially perpendicular to the movement of the moveable comb, and since the stationary comb elements are typically equidistantly spaced from each corresponding moveable comb finger, the parallel plate force is generally offset and can (for the most part) be ignored.

A third of such attractive forces is a variation of the parallel plate force referred to as a "parasitic tip force". This parasitic tip force generally refers to the attraction of each free end of each moveable comb finger toward the base beam of the stationary comb (and/or the attraction of each free end of each stationary comb finger for the base beam of the moveable comb). Accordingly, the parasitic tip force is generally oriented in direction that is substantially parallel to the movement of the moveable comb. This parasitic tip force generally is insignificant to the function of the electrostatic comb actuator until the free ends of the moveable comb fingers reach (or surpass) some minimum threshold distance of separation with respect to the base beam of the corresponding stationary comb.

Even though the attractive forces of an electrostatic actuator are generally opposed by an attached suspension assembly (typically providing some sort of restorative force), the parasitic tip force, in combination with the comb force, tends to overcome restorative forces of conventional suspension assemblies. In other words, as the free ends of the moveable comb fingers tend reach or surpass this minimum threshold distance of separation from the base beam of the stationary comb, this parasitic tip force causes an increase in the attractive forces of the stationary comb. It can be said then that the total attractive force of the stationary comb increases in a substantially nonlinear fashion at least when the free ends of the moveable comb fingers reach or surpass the minimum threshold distance.

As a result, conventional suspension assemblies have allowed their attached moveable combs to remain locked into an interdigitated engagement with the corresponding stationary comb, thus rendering the electrostatic actuator at least temporarily inoperable. While conventional electrostatic actuators have traditionally relied on a reduction in the voltage applied to the stationary comb and/or the restorative spring force of the accompanying suspension assembly to provide a restoring force to draw the moveable comb(s) back out of (or at least to a lesser degree) interdigitation with the stationary comb(s), the designs of conventional suspension assemblies have not been able to successfully address the occurrence of runaway conditions and associated adhesion/ stiction between the fingers of the stationary and moveable combs (or other opposing elements of a MEM system). In other words, once a moveable comb has been urged toward a corresponding stationary comb (generally via voltage applied to the stationary comb), the moveable comb may "snap" into and maintain, at least momentarily, an interdigitated actuation relationship with the stationary comb even after the applied voltage has been reduced. Stated another way, the designs/configurations of conventional suspension assemblies have not been successful at combating the additional parasitic force to avoid runaway conditions or, where such conditions have occurred, to overcome the tendency for corresponding moveable and stationary combs to stay "stuck" together until the applied voltage has been reduced below some threshold value. Several attempts have been made to combat this problem. For example, some attempts have included varying the length and/or thickness of spring arms associated with the suspension assembly, however such attempts have generally proven unsuccessful.

An additional consideration is that the "space" (or "real estate") on a base substrate to which a MEM system is formed is generally limited. Accordingly, MEM systems are continually being designed to reduce the space occupied by electrostatic actuators. A significant amount of the designs include moving the combs elements of the actuator assemblies closer together, requiring even greater control of the comb elements. Accordingly, it would be desirable to provide a suspension assembly that is capable of addressing both the comb forces and parasitic forces associated with electrostatic comb actuators.

SUMMARY OF THE INVENTION

Accordingly, the present invention is generally directed to microelectromechanical (MEM) systems. More specifically, the present invention relates to a suspension assembly for supporting an actuation apparatus (e.g. a movable electrostatic comb) of a microelectromechanical system. The suspension assembly of the present invention desirably addresses the lack of electrostatic element control associated with conventional suspension assemblies. While particularly desirable applications of this suspension assembly may be in microelectromechanical (MEM) systems (e.g., optical switches), the suspension assembly of the present invention may be utilized in any appropriate application for which enhanced control of a microstructure is desired/required.

A first aspect of the present invention relates to a method and system involving a suspension that provides a restoring force (e.g., to resist the attractive force between converging comb elements and/or pull an attached moveable comb element away from a corresponding stationary comb) having a non-linear characteristic. Thus, this first aspect at least assists in controlled movement of a first moveable element of a microelectromechanical system relative to a base substrate. The system generally includes a moveable element supported at least in part by a suspension. The moveable element is moveable across a range of displacement. The suspension assembly exerts a restorative force that varies as a nonlinear function of displacement within the displacement range. In one embodiment, the system includes a moveable beam having first and second lateral sides, and at least one suspension arm extending laterally out from the beam. For example, multiple suspension arms may extend from the first and second lateral sides of the beam.

Various refinements exist of the features noted in relation to the first aspect of the present invention. Further features may also be incorporated in this first aspect as well. In addition, various features discussed herein in relation to one or more of the other aspects of the present invention may be incorporated into this or any other aspect of the present invention as well, and in the manner noted herein.

A second aspect of the present invention relates to a method and system involving a suspension assembly that includes at least one arm having a nominal length (in a resting position) and a stretched length (in a stretched position) longer than the nominal length of the arm. The system generally includes a moveable member and one stretchable arm interconnected to the moveable member. The arm may be anchored to a substrate or otherwise constrained so as to stretch in response to or otherwise in connection with movement of the moveable member. In one embodiment, the system includes a moveable center member having first and second lateral sides, and one or more of each of first and second arms extending laterally out from the center beam. Generally, the first arms extend from the first lateral side of the center beam, and the second arms extend out from the second lateral side of the center beam. Preferably, the first and second arms exert substantially counteracting lateral forces on the center member. Each of the first and second arms has a nominal length, and when the center member of the system is in a displaced position, each of the first and second arms has a stretched length. As the terms tend to indicate, the stretched length is generally longer than the resting length of the corresponding first and second arms.

Various refinements exist of the features noted in relation to the second aspect of the present invention. Further features may also be incorporated in this second aspect as well. These refinements and additional features may exist individually or in any combination. For example, the longitudinal center member can include first and second elements that are joined together. In other words, the first and second elements may be interconnected to function as a single, solitary beam unit. One way of accomplishing this include a homogenous interface that results during the fabrication process of the suspension assembly. However, other ways (e.g., welding or clamping) of joining two beams together to function as a single beam structure may be appropriate.

The first and second arms can be substantially perpendicular to the center member when the center member is in a resting position. A "resting position" generally refers to the condition of the center beam when substantially no actuation forces (e.g., electrostatic static forces) are acting upon the member. In other words, the resting position generally reflects a positioning which effectively indicates a substantial freeness from biasing force(s).

A third aspect of the present invention relates to a method and system involving a suspension assembly that provides a restoring force defined at least in part by one or more arms of the suspension assembly being bent/flexed to provide a spring force and one or more arms of the suspension assembly (the same or different than the bent/flexed arms) being stretched to provide a tensile force. This third aspect at least generally assists in controlled movement of a first moveable member of the system relative to a base substrate. The system of this third aspect generally includes a first moveable beam and one or more first suspension arms. When the first moveable beam is moved, one of the suspension arms is at least stretched, and one of the suspension arms is at least flexed.

Various refinements exist of the features noted in relation to the third aspect of the present invention. Further features may also be incorporated in this third aspect as well. These refinements and additional features may exist individually or in any combination. For example, one or more of the suspension arms may be anchored to the base substrate. Additionally or alternatively, one or more of the suspension arms may be free of restrictive connections to the base substrate. In one embodiment, some suspension arms are anchored and others are not. In any event, either or both of the anchored and unanchored arms may stretch, and either or both may flex.

A fourth aspect of the present invention relates to a method and system involving supporting a first structure of a system by providing a suspension restoring force as resistance to an attractive electrostatic force. The restoring force is preferably directed opposite the actuation force and, more preferably, increases/decreases generally proportionately to the actuation force, in each case, as a function of displacement. The system generally includes a base substrate, an actuation structure, and a first suspension structure. The actuation structure is generally interconnected with a first actuator element of the microelectromechanical system. The first suspension structure generally allows for movement of the actuation structure across a range of positions relative to the base substrate in response to a corresponding range of actuation forces applied to the actuation structure. This range of positions is generally defined by a first position corresponding to a first actuation force value of zero or greater and a second position corresponding to a second actuation force greater than the first actuation force. The first linkage structure provides a non-linear resistance force against the actuation force such that the resistance force varies in a nonlinear fashion with respect to positions within the range of positions.

Various refinements exist of the features noted in relation to the fourth aspect of the present invention. Further features may also be incorporated in this fourth aspect as well. These refinements and additional features may exist individually or in any combination. For example, the first position may include the first actuator element being dissociated (i.e., separated by a first distance) from a second actuator element.

A fifth aspect of the present invention is embodied in a suspension assembly formed on a base substrate and having a support structure, and an intermediate actuation structure. The support structure is generally interconnected with the base substrate and generally includes a medial support rail and a plurality of support beams extending out from first and second lateral sides of the medial support rail. The intermediate actuation structure is generally interconnected with the support structure and disposed between the support structure of the suspension assembly and the base substrate of the microelectromechanical system. The suspension assembly of this fifth aspect also generally includes a first linkage structure operatively interposed between the base substrate and the support structure. In addition, the suspension assembly also has a second linkage structure operatively interposed between the support structure and the intermediate actuation structure.

Various refinements exist of the features noted in relation to the fifth aspect of the present invention. Further features may also be incorporated in this fifth aspect as well. These refinements and additional features may exist individually or in any combination. For example, the actuator element is preferably interconnected to the intermediate actuation structure; however, other locations of the actuator element may be appropriate. The actuator element may be connected to the intermediate actuation structure in such a manner that the actuator element and the support structure are substantially coplanar. This actuator element can be a variety of appropriate microstructure devices including, but not limited to, an electrostatic comb.

The support structure in the case of this fifth aspect may include a medial support rail and a plurality of support beams extending out from the medial support rail. In such variations, the support beams may have distal ends remotely disposed from the medial support rail, and connected to the base substrate (which may include a voltage reference plane of sorts) via linkages of the first linkage structure. This first linkage structure may generally enable at least part of the support structure to move relative to the base substrate. Similarly, the second linkage structure may generally enable at least part of the intermediate actuation structure to move relative to at least one of the support structure and the base substrate. In some variations of this fifth aspect, the first and/or second linkage structures may exhibit a resilience (i.e., have some detectable elasticity, while other variations may include one or both the first and second linkage structures being substantially rigid (i.e., being devoid of any detectable amount of elasticity. One or both of these first and second linkage structures may be made up of at least one layer of polysilicon. In some variations, the first linkage structure may be made up of at least three layers of polysilicon.

In the case of this fifth aspect, the actuation beams of the support structure may have peripheral ends remotely disposed from the central actuation rail and connected to the support structure via the second linkage structure. In some variations, the intermediate actuation structure only interconnects with the base substrate via the support structure. In other words, the intermediate actuation structure generally is designed/configured to avoid direct contact with the base substrate. The intermediate actuation structure may be suspended over the base substrate due to the second linkage structure connecting the intermediate actuation structure to the support structure. If the intermediate actuation structure is displaced by a first distance, the support structure can generally be displaced by a second distance less than the first distance. The intermediate actuation structure may have at least one linkage channel. That is, at least a portion of the first linkage structure may pass through the linkage channel (s) so as to enable the intermediate actuation structure to move without interference from the first linkage structure. The linkage channel(s) preferably are oblong or elliptical, however, other designs/configurations may be appropriate (e.g., rectangular). The intermediate actuation structure may include first and second lateral actuation rails which are substantially parallel to a direction of movement of the intermediate actuation structure, and optionally, at least one actuation beam connecting the first lateral actuation rail to the second lateral actuation rail. The intermediate actuation structure may have a central actuation rail positioned between the first and second lateral actuation rails. A plurality of actuation beams may be utilized to connect the first and second lateral actuation rails to the central actuation rail. In some variations, at least one actuation beam of the plurality of actuation beams perpendicularly interfaces with at least one of the first lateral actuation rail, the second lateral actuation rail, and the central actuation rail. Those various features discussed above in relation to the fifth aspect of the present invention may be incorporated into any of the other aspects of the present invention as well, and in any appropriate manner noted herein.

A sixth aspect of the present invention is embodied in a suspension assembly including a first support structure, a second support structure, and an intermediate actuation structure (at least one of which is preferably formed from polysilicon). The first support structure is generally interconnected with a base (which is generally a silicon wafer or any other appropriate base substrate) of a microelectromechanical system. The second support structure is generally interconnected with the first support structure so that the first support structure is positioned between the second support structure of the suspension assembly and the base of the MEM system. The intermediate actuation structure is preferably interconnected with at least one actuator element (e.g. an electrostatic comb) and is generally operatively interposed between and interconnected with the first support structure and the second support structure of the suspension assembly. In other words, using a "bottom-to-top" description, the first support structure is positioned toward the bottom (i.e. near or adjacent the base) of the suspension system, and the second support structure is generally disposed opposite the first support structure toward the top of the suspension system. The intermediate actuation structure is preferably "sandwiched" between the first and second support structures of the suspension system. In this sixth aspect of the present invention, at least one of the first and second support structures generally includes a longitudinal center support beam having elongate first and second lateral sides. This longitudinal center beam generally has a plurality of arms connected to and extending out from the first and second lateral sides of the center support beam.

Various refinements exist of the features noted in relation to the sixth aspect of the present invention. Further features may also be incorporated in this sixth aspect as well. These refinements and additional features may exist individually or in any combination. For example, at least a portion of the intermediate actuation structure may be displaced by a first distance with regard to the base. In response to at least a portion of the intermediate actuation structure being displaced by the first distance, at least a portion of one or both of the first and second support structures may be displaced by a second distance. In some variations, the first distance that the intermediate actuation structure is displaced by may be at least about 2 times greater than the second distance by which at least a portion of one or both the first and second support structures is displaced. For example, a portion of the intermediate actuation structure may be displaced a distance of about 5.8 microns, which in turn may result in a portion of one or both the first and second support structures being displaced a distance of about 2.9 microns.

In the case of the first support structure of the sixth aspect having a center support beam, the plurality of arms may include first, second, third, and fourth lower support arms that are interconnected with the center support beam and at least first and second lower flex arms that are interconnected with the center support beam. The first and second lower support arms and the first lower flex arm may generally be disposed on the first lateral side of the center support beam. Accordingly, the third and fourth lower support arms and the second lower flex arm may generally be disposed on the second lateral side of the center support beam.

In the case of the first support structure of the sixth aspect having a center support beam, the first, second, third, and fourth lower support arms may include respective first, second, third, and fourth fixed ends generally being remotely disposed from the center support beam. In other words, these first, second, third, and fourth fixed ends of the respective first, second, third, and fourth lower support arms are generally positioned opposite the respective ends of attachment to the center support beam. These first, second, third, and fourth fixed ends may be interconnected with the base.

In the case of the sixth aspect, a plurality of base anchors may connect the first support structure to the base. More-specifically, some variations include a plurality of base anchors connecting the first, second, third, and fourth fixed ends of the respective first, second, third, and fourth lower support arms of the first support structure to the base. In some variations, the base has a voltage reference plane. Accordingly, some variations may exhibit one or more of base anchors positioned on the voltage reference plane.

Referring to variations of the sixth aspect having lower flex arms, the first lower flex arm may generally be positioned between the first and second lower support arms. Similarly, the second lower flex arm may generally be positioned between the third and fourth lower support arms. However, other positions of one or both the first and second lower flex arms may be appropriate. In some variations of the sixth aspect, the first lower flex arm may be substantially aligned with the first and second lower support arms. Likewise, the second lower flex arm may be substantially aligned with the third and fourth lower support arms. An entirety of each of the first and second lower flex arms may be separate from and avoid direct contact with the base. In other words, the first and second lower flex arms may be substantially unimpeded by any interconnection of the first and second lower flex arms to the base. The first and second lower flex arms may include respective first and second free ends that may be remotely disposed from the center support beam. In other words, these free ends of the lower flex arms are generally located opposite the ends that connect to the center support beam. The first and second free ends of respective first and second lower flex arms may be separated from and avoid direct contact with the base. In other words, at least some vertical clearance may exist between the base and the first and second free ends of the respective first and second lower flex arms. Some variations of the sixth aspect may include third and fourth lower flex arms interconnected with the center support beam. These third and fourth lower flex arms may have respective third and fourth free ends that are remotely disposed from the center support beam. The third and fourth free ends of the respective third and fourth lower flex arms may be separated from the base.

In the case of the second support structure of the sixth aspect having a center support beam, the plurality of arms may include first, second, third, and fourth upper support arms interconnected with the center support beam and at least first and second upper flex arms interconnected with the center support beam. The first and second upper support arms and the first upper flex arm are generally disposed on the first lateral side of the center support beam. Accordingly, the third and fourth upper support arms and the second upper flex arm are generally disposed on the second lateral side of the center support beam.

Referring to variations of the sixth aspect having upper flex arms, the first upper flex arm may generally be positioned between the first and second upper support arms. Similarly, the second upper flex arm may generally be positioned between the third and fourth upper support arms. The first upper flex arm may be substantially aligned with the first and second upper support arms. Likewise, the second upper flex arm may be substantially aligned with the third and fourth upper support arms. In some variations, an entirety of each of the first and second upper flex arms may be separated from and avoid direct contact with the base. That is, the first and second upper flex arms may be substantially unimpeded by any interconnection of the first and second upper flex arms to the base. These first and second upper flex arms may include respective first and second free ends that are remotely disposed from the center support beam. These first and second free ends of the respective first and second upper flex arms may be separated from and avoid direct contact with the base. Some variations of the sixth aspect may include third and fourth upper flex arms that are interconnected with the center support beam. These third and fourth upper flex arms may have respective third and fourth free ends that are remotely disposed from the center support beam. These third and fourth free ends may be separated from the base. In other words, at least some vertical clearance may exist between the base and these third and fourth free ends.

In some variations of the sixth aspect, the first, second, third, and fourth upper support arms may include respective first, second, third, and fourth fixed ends that are remotely disposed from the center support beam. In other words, the fixed ends of the upper support arms are positioned opposite the ends of the respective support arms that connect with the center support beam. These first, second, third, and fourth fixed ends of the respective first, second, third, and fourth upper support arms may be interconnected with the first support structure. Some variations of the sixth aspect may include a plurality of support anchors interconnecting first, second, third, and fourth fixed ends of the respective first, second, third, and fourth upper support arms of the second support structure to the first support structure.

In the case of the sixth aspect, the intermediate actuation structure may include a central actuator beam interconnected with a displacement multiplier. Displacement multipliers are described in U.S. Pat. No. 6,175,170 to Kota et al. and issued on Jan. 16, 2001, the entire disclosure of which is incorporated by reference herein. The intermediate actuator structure may include the central actuator beam being interconnected with an elevator assembly for positioning a microstructure. The central actuator beam may be parallel to and vertically spaced from the center support beam. In some variations, the central actuator beam may include one or more laterally extending actuator arms. The actuator element (e.g., an electrostatic comb) may be connected to at least one of these laterally extending actuator arms.

In the case of this sixth aspect, a plurality of actuation connectors may be positioned between and interconnect the first support structure with the intermediate actuation structure. Similarly, a plurality of actuation connectors may be positioned between and interconnect the second support structure with the intermediate actuator structure. In some variations, the actuation connectors may be disposed between the intermediate actuation structure and one or more flex arms of one or both the first and second support structures. In one variation, the actuation connectors may be positioned at the free end(s) of one or more of the respective flex arms.

Some variations of the sixth aspect may exhibit configurations wherein each lateral side of the center support rail includes a plurality of support arms and flex arms oriented in an alternating fashion. Other variations of the sixth aspect may exhibit configurations having two or more flex arms adjacent one another on the same lateral side of the center support beam (i.e., no support arm is positioned between the flex arms). Some variations of the sixth aspect may exhibit configurations wherein the number, size, shape, and orientation of the flex and support arms positioned on the first lateral side of the center support beam are a mirror image of the number, size, shape, and orientation of the flex and support arms positioned on the second lateral side of the center support beam. However, other variations of the sixth aspect may exhibit configurations wherein one or more of the number, size, shape, and orientation of one or both the flex and support arms positioned on the first lateral side of the center support beam may differ from one or more of the number, size, shape, and orientation of one or both the flex and support arms positioned on the second lateral side of the center support beam.

At least portions of the second support structure, in the case of the sixth aspect, may be substantially parallel to and vertically spaced from the first support structure. Some variations of the sixth aspect may exhibit only one of the first and second support structures having first and second center support rails, which may be substantially parallel to and vertically spaced from the center support beam. In such variations, the first center support rail may be laterally spaced from and substantially parallel to the second center support rail. The sixth aspect may also include some variations wherein each of the first and second support structures includes a center support beam. Some variations may exhibit both the first and second support structures having respective first and second pluralities of arms. In such variations, the first plurality of arms may be vertically spaced from and substantially parallel to the second plurality of arms. Regardless, one or more of the intermediate actuation structure and the first and second support structures, if the suspension assembly may be made from a structural material having a tensile strength of at least about 0.25 GPa. Those various features discussed above in relation to the sixth aspect of the present invention may be incorporated in any other aspects of the present invention, and in any appropriate manner noted herein.

A seventh aspect of the present invention is embodied in a suspension assembly for at least assisting in supporting a first actuation element of a microelectromechanical system and allowing movement of the first actuation element of a microelectromechanical system relative to a base substrate. The suspension assembly of this seventh aspect generally includes a longitudinal support beam having elongate first and second lateral sides and a plurality of first lateral beams extending out from the first and second lateral sides of the support beam. In addition, at least one of the first lateral beams of this seventh aspect is generally anchored to the base substrate. In other words, at least a portion of one of these first lateral beams is generally substantially immobilized by some attachment to the substrate.

Various refinements exist of the features noted in relation to the seventh aspect of the present invention. Further features may also be incorporated in this seventh aspect as well. These refinements and additional features may exist individually or in any combination. For example, the first lateral beams may be oriented in a substantially perpendicular relationship with respect to the support beam. At least one of the first lateral beams may include a fixed end disposed most remote from the support beam. This fixed end may be anchored to the base substrate. In some variations, ones of the first lateral beams may be vertically spaced from and devoid of any anchoring to the base substrate. In other words, a lower surface(s) (i.e., the surface of the respective first lateral beam which faces the base substrate) of the first lateral beam(s) is generally free from any attaching means which would interconnect the lower surface of the first lateral beam to the base substrate.

In the case of the seventh aspect, the plurality of first lateral beams may be anchored to the base substrate. Each of these first lateral beams may include a fixed end that is disposed most remote from the support beam (i.e., opposite from the end that attaches to the support beam) and that is generally anchored to the base substrate. Some variations of this seventh aspect may include a plurality of second lateral beams. The second lateral beams may be oriented in a substantially perpendicular relationship with respect to the support beam. The second lateral beams may be oriented in a substantially parallel relationship with respect to the first lateral beams. However, other orientations of the second lateral beams may be appropriate. Each of the second lateral beams may include a free end that may be vertically spaced from and devoid of any anchoring to the base substrate.

Some variations of this seventh aspect may include an actuation assembly. The actuation assembly of this seventh aspect may have a plurality of actuation beams oriented substantially parallel to the support beam and interconnected with ones of the plurality of the first lateral beams. This actuation assembly may be vertically displaced from the support beam. In some variations, the first actuation element may be interconnected to at least one of the actuation beams. Some variations may exhibit the actuation assembly having a plurality of third lateral beams oriented substantially perpendicular to the plurality of the actuation beams and extending between and interconnecting at least ones of the plurality of the actuation beams. In such variations, the first actuation element may be interconnected to at least one of the plurality of third lateral beams.

A suspension assembly of this seventh aspect may include a support assembly generally having a first central beam, a second central beam adjacent to the first central beam, and a plurality of fourth and fifth lateral beams extending out from the first and second central beams. In some variations, one or both the plurality of third lateral beams and the plurality of fourth lateral beams may be interconnected with the plurality of first lateral beams. The plurality of actuation beams of the actuation assembly may be disposed between and interconnected with the plurality of first lateral beams and the plurality of fifth lateral beams. Those various features discussed above in relation to any of the aspects of the present invention may be incorporated in any other aspects of the present invention, and in any appropriate manner noted herein.

BRIEF DESCRIPTION OF THE DRAWINGS

FIG. 2A is a line graph illustrating how the spring force of the suspension assembly of FIG. 1 changes with respect to displacement.

FIG. 2B is a line graph illustrating how attractive forces relating to voltage relate to displacement.

FIG. 2C is a line graph illustrating how the resistance force of the suspension assembly of FIG. 3A changes with respect to displacement.

FIG. 2D is a line graph illustrating how the displacement of the suspension assembly of FIG. 3A relates to the voltage depicted in FIG. 2B.

DETAILED DESCRIPTION

Figure 1:
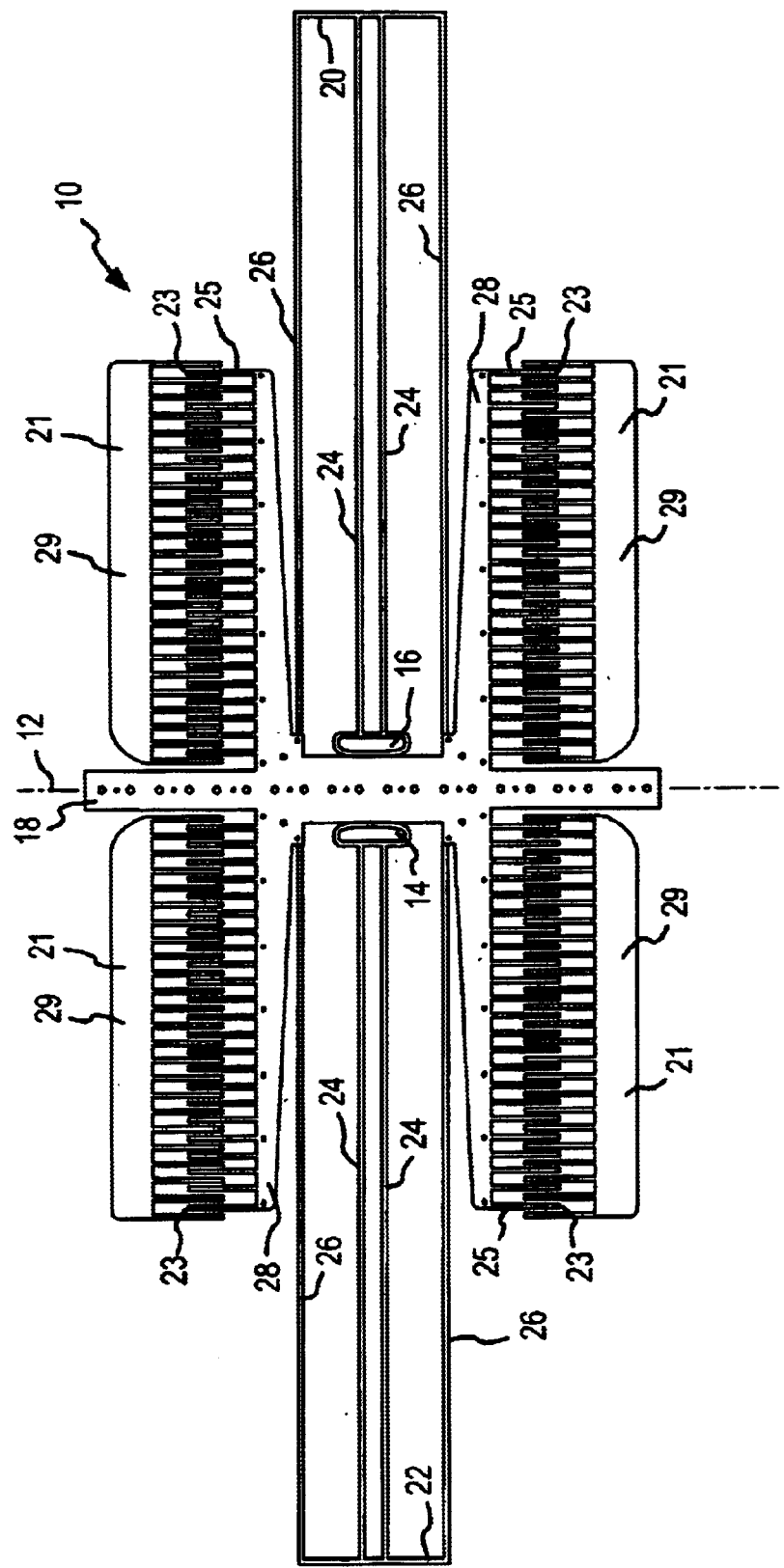
FIG. 1 is a top view of a suspension assembly.

The present invention will now be described in relation to the accompanying drawings, which at least assist in illustrating its various pertinent features. FIG. 1 illustrates a suspension assembly 10 having first and second anchors 14 and 16 connected to a base substrate (not shown). These anchors 14, 16 are centrally located and positioned on opposite sides of a central, longitudinally-extending actuation rail 18, which has a central, longitudinal reference axis 12 extending therethrough. First and second intermediate bars 20, 22 are laterally positioned on opposite sides of the central actuation rail 18 so that, at least in a first resting position, the first and second intermediate bars 20, 22 are generally parallel to the central longitudinal reference axis 12. When the actuator rail 18 is urged back and/or forth in a direction substantially parallel with the central longitudinal reference axis 12, the first and second intermediate bars 20, 22 generally pivot on the interior flexure arms 24 and exterior flexure arms 26 and move arcuately in space (e.g., like the suspension on a "glider" rocking chair) so that little or no stretching or compression forces act on the flexure arms 24, 26. In other words, flexure arms 24, 26 do not significantly expand or contract due to actuation forces acting on a comb structure 28. As a result, the spring force exerted by flexion of each arm 24 and/or 26, which through its inherent spring constant attempts to restore the suspension to its resting position and therefore counteracts the actuation force, is essentially governed by the spring law of "$F_s=-kx$" (Hooke's Law), wherein "$F_s$" is the amount of force exerted by the arm/spring, "k" is the spring constant for the material which makes up the arm/spring, and "x" is the amount of displacement of the arm/spring from its resting (or equilibrium) position. The negative sign indicates that the spring force is a restoring force (i.e., the force "$F_s$" always includes a force vector that acts in the opposite direction of the actuation force, which functions to displace the arm/spring).

Referring to FIG. 2A, as a result of the movement of the suspension assembly 10 being governed by the spring law, the overall response of the suspension assembly 10 is substantially linear in that, at any point in the range of motion of the suspension assembly 10, an additional unit of displacement from the resting/equilibrium position will increase the spring force (i.e., resistance to the actuation force) in direct proportion. This phenomenon is indicated by the solid line 30 of FIG. 2A wherein reference number 32 indicates the resting/equilibrium position of the arm/spring, and reference number 34 indicates the maximum amount of displacement the arm/spring may be subject to (e.g., the amount of potential bend of the arm(s) 24, 26 until the comb structure 28 reaches the maximum allowed extent of interdigitation with a corresponding stationary comb structure 29). This maximum amount of displacement is generally controlled by some sort of mechanical stop apparatus that prevents the fingers of the moveable comb from "bottoming out" against the base beam of the stationary comb. If no such mechanical stop is present, a "bottoming out" of the fingers of the moveable comb against the base beam of the stationary comb can result in a short that may damage or destroy the system.

However, it is well known that the electrostatic force of attraction ($F_a$) pulling the comb structure 28 toward the corresponding stationary comb 29 exhibits a non-linear response due to the force of attraction ($F_a$) being a function of the square of the applied voltage ($V^2$). The total attractive electrostatic force ($F_t$) also increases in a non-linearly fashion when the parasitic tip force from a base beam 21 of the stationary comb 29 attracts the free ends 23 of the fingers 25 of the moveable comb 28 toward the base beam 21 (e.g., when the free and 23 of the fingers 25 reach or surpass a minimum threshold distance from the base beam 21 of the stationery comb 29). In other words, the attractive comb forces are supplemented by these attractive parasitic tip forces. As a result, the actuation force curve indicated by solid line 36 in FIG. 2B is non-linear. That is, a control signal (e.g., voltage) applied to create an electrostatic force of attraction to urge the actuator rail 18 to a desired point varies non-linearly at least at some point in a range of displacement of the moveable comb 28. As a result, at the extreme end 34 of the range of displacement, very small changes in control voltage may result in large movements of the actuator rail 18, thus adding complexity to precision control of the suspension assembly 10. In the context of the actuator element being an electrostatic comb, it may be difficult to avoid "runaway" conditions where the amount of voltage urges one of the movable combs 28 (and accordingly the actuation rail 18) to snap uncontrollably to the maximum displacement condition 34 (e.g., "bottoming out" against the stationary comb 29 or a mechanical stop). In the context of a microstructure such as an optical switch, this may make it difficult to accurately target a desired fiber or output port, especially if a large mirror tilt is required/desired. Additionally, and as a practical matter, this may limit the size of the optical switch and number of ports accommodated.

Figure 3A:
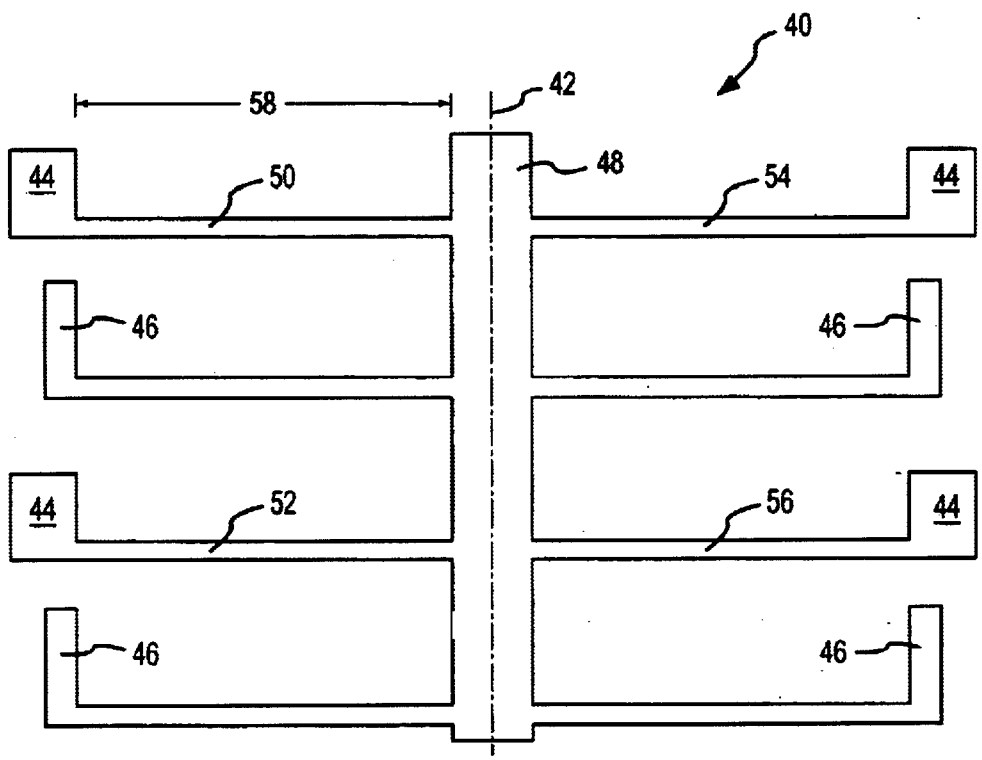
FIG. 3A is a top view of a suspension assembly in a resting position.

By contrast, a simplified variation of the invention to illustrate some the principles involved is shown in FIG. 3A. A variety of significant differences, both in structure and function, exist between the suspension assembly 10 of FIG. 1 and a suspension assembly 40 of the present invention illustrated in FIG. 3A. The suspension assembly 40 of FIG. 3A includes a central, longitudinal reference axis 42 and anchors 44 which are separated from the references axis 42 and placed at/near lateral extremities of the suspension assembly 40 (as contrasted with the centrally located anchors 14, 16 of FIG. 1). These anchors 44 provide a means for attachment of the suspension assembly 40 to a base substrate (not shown). Instead of having a central actuation rail 18 as in FIG. 1, the suspension assembly 40 of FIG. 3A has a plurality of laterally positioned actuation rails 46. The suspension assembly 40 also has a central intermediate bar 48 (rather than multiple intermediate bars 20, 22 of the suspension assembly 10 of FIG. 1). This central intermediate bar 48 can be a single unit, or can be made up of first and second longitudinally-extending and laterally spaced bars that are subsequently clamped or welded together (i.e., integrated) to function as a single intermediate bar 48. In any event, the suspension assembly 40 of FIG. 3A has effectively turned the suspension assembly 10 of FIG. 1 "inside-out". In other words, components (such as the anchors 14, 16, and the actuation rail 18) of FIG. 1, which were centrally located on the suspension assembly 10, are generally positioned at lateral extremities of the suspension assembly 40 of FIG. 3A. Similarly, components (such as the intermediate bars 20, 22) of FIG. 1, which were laterally located at the periphery the suspension assembly 10, are generally positioned at central portions of the suspension assembly 40 of FIG. 3A.

While a cursory overview of the structural differences between the suspension assemblies 10 and 40 of the respective FIGS. 1 and 3A may seem to be mere semantics, such an "inside-out" arrangement coupled with the formation of the single intermediate bar 48 of FIG. 3A provides structural and functional benefits previously undiscovered. The intermediate bar 48 is a single structure with anchors 44 positioned laterally on both sides of the intermediate bar 48. Thus, conversely, the intermediate bar 48 of the suspension assembly 40 is constrained to reciprocate linearly due to mirror image forces from the two sides of the suspension assembly 40. In other words, the intermediate bar 48 will generally move in a linear direction substantially parallel with the reference axis 42.

Figure 3B:
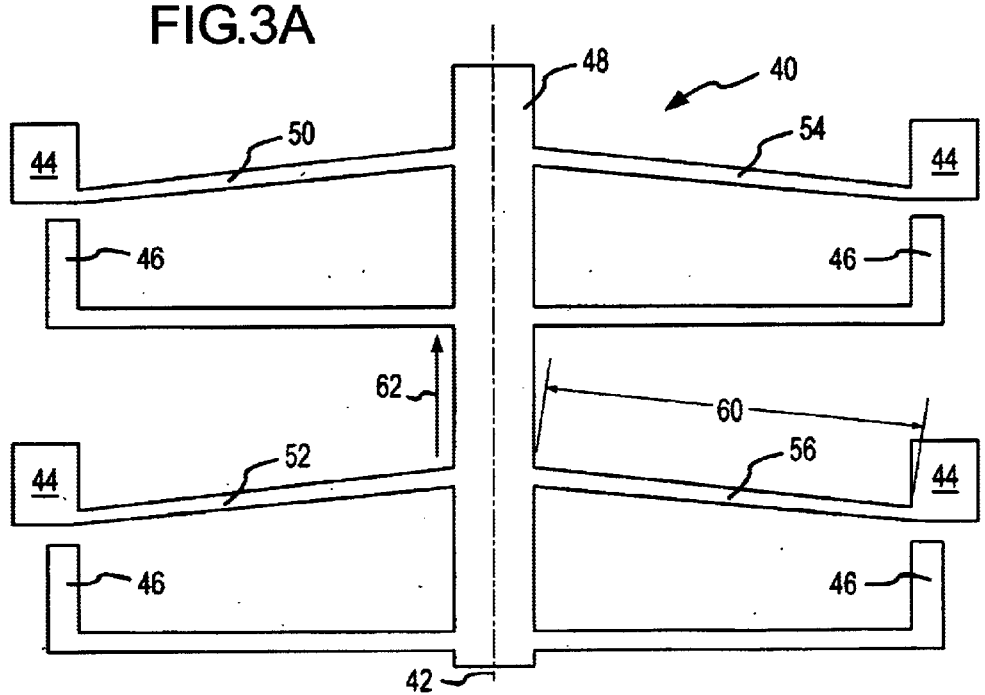
FIG. 3B is a top view of the suspension assembly of FIG. 3A in an actuated position.

Thus, as shown in FIG. 3B, longitudinal displacement (i.e., in a direction substantially parallel with the reference axis 42) of the intermediate bar 48 then requires that at least the arms 50, 52, 54, 56 stretch (rather than substantially relying on flexing/bending as in the suspension assembly 10). That is, in a resting/equilibrium position (shown in FIG. 3A), the arms 50, 52, 54, 56 are substantially perpendicular to the intermediate bar 48 and have a nominal length 58. When the intermediate bar 48 is urged in a direction indicated by arrow 62 (as in FIG. 3B) through a displacement distance of, for example, 2.9 $\mu$m, the arms 50, 52, 54, 56 are stretched to a stretched length 60 (FIG. 3B) greater than the nominal length 58 (FIG. 3A). As discussed below, the remaining arms 46 may also be stretched depending on the specific implementation. Thus, in addition to a spring force ($F_s$) that resists the actuation force ($F_s$), the suspension assembly 40 also provides a resistance due to the stretching (i.e., extension) of the arms 50, 52, 54, 56, which is a generally elastic function that depends on (among other factors) the tensile strength of the material used to make the arms 50, 52, 54, 56 (herein referred to as the "tensile force"). This tensile force varies in a non-linear fashion relative to displacement of the actuator rails 46. Thus, the resistance force of the suspension assembly 40 is a function of both the spring force and the tensile force that varies non-linearly with displacement. This phenomenon is indicated by the solid line 31 of FIG. 2C wherein reference number 33 indicates the resting/equilibrium position of the arms 50, 52, 54, 56, and reference number 35 indicates the maximum amount of displacement the arm 50, 52, 54, 56 may be subject to.

Again, it is well known that the force of attraction ($F_a$) acting on the actuator rails 46 does not function on a linear basis, but increases with respect to the square of the applied voltage ($V^2$). As a result, the actuation force curve indicated by solid line 36 in FIG. 2B is nonlinear. However, since the resistance force of the suspension assembly 40 of FIG. 3A varies non-linearly with regard to displacement, the suspension assembly may be designed such that the curves of FIGS. 2B and 2C may be nearly directly related by a constant. That is, at any point across the displacement range, an additional unit of applied voltage preferably requires a directly proportional increase the resistance force supplied by the suspension assembly 40. In other words, voltage applied as a control signal to displace the actuator rails 46 by a desired amount varies in a previously unattainable substantially linear fashion with respect to displacement using the suspension assembly 40 as shown by line 37 in FIG. 2D.

Figure 4:
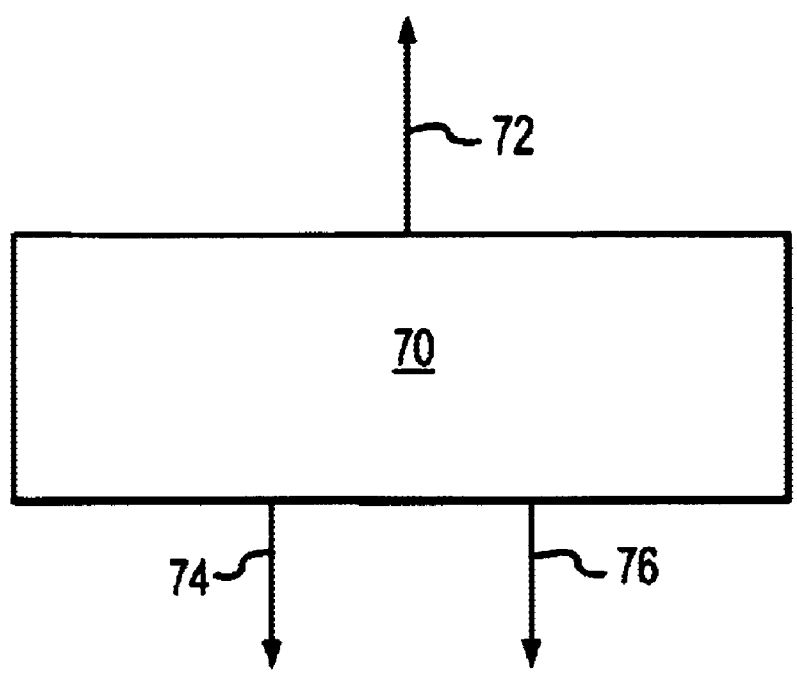
FIG. 4 is a schematic force diagram showing forces imposed on an actuation element.

Summarily, forces that are effected on an actuation element 70, which is interconnected with a suspension assembly (such as 40 of FIGS. 3A and 3B), are illustrated in FIG. 4. The actuation force 72 (generally being the sum of the comb force and parasitic force) urges the actuation element 70 in the direction of the arrow that represents actuation force 72. Resistance forces (also referred to herein as restoration forces), which function to bias the actuation element 70 to a resting position, are oriented in an opposite direction of the actuation force 72 and generally may include one or both a spring force 74 component and a tensile force component 76. Generally, the spring force 74 may be provided by bending/flexing one or more of the various arms 46, 50, 52, 54, 56. Similarly, the tensile force 76 may be provided by stretching/elongating one or more of the various arms 46, 50, 52, 54, 56.

Figure 5:
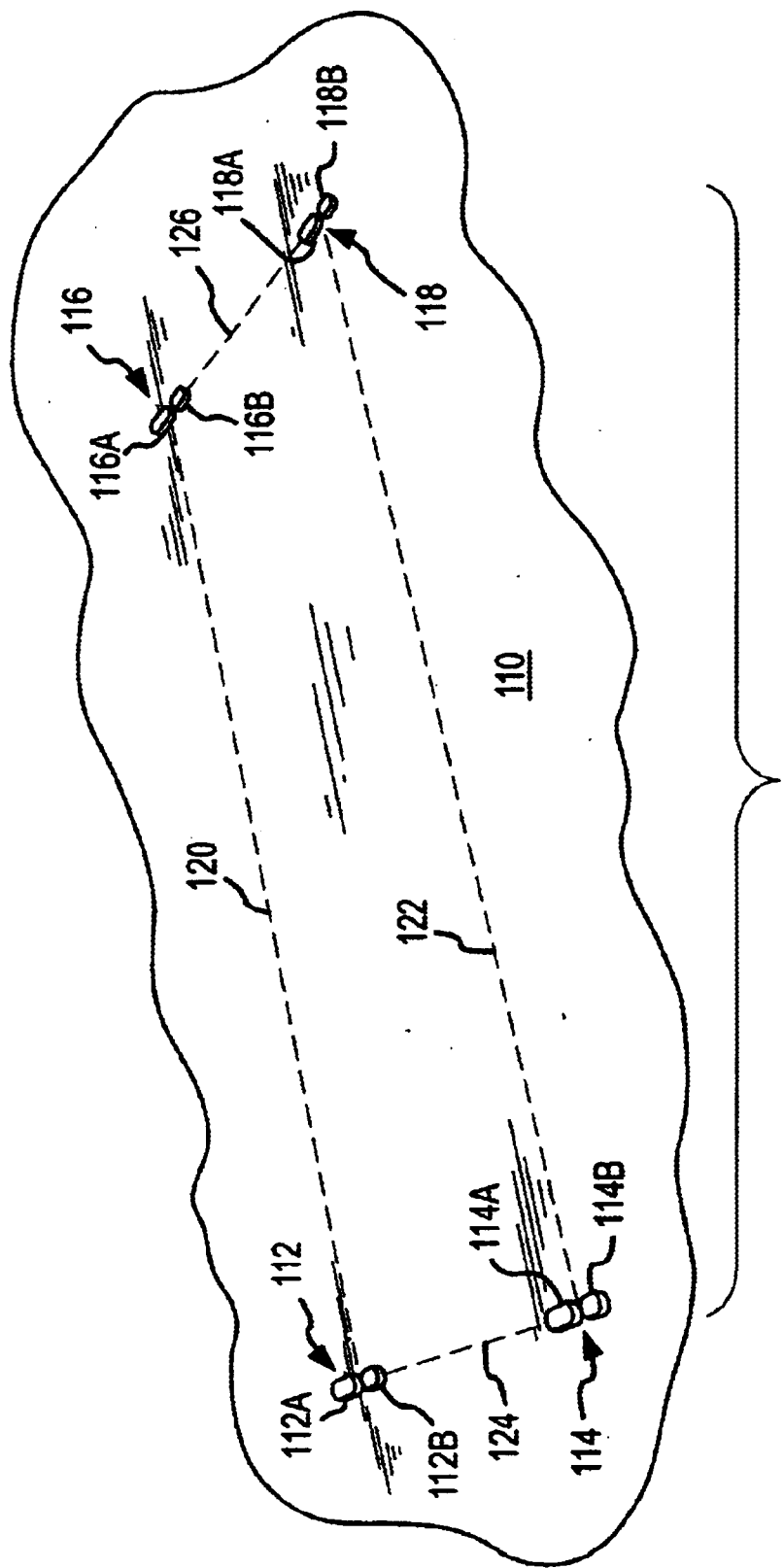
FIG. 5 is a perspective view showing base anchors of a suspension assembly.

FIGS. 5–14 illustrate an embodiment of a suspension assembly 100 on a structure-by-structure basis according to a fabrication sequence. Accordingly, FIG. 5 shows respective first, second, third, and fourth base anchors 112, 114, 116, 118 attached to a base substrate 110. This surface of this base structure 110 to which the base anchors 112, 114, 116, 118 attach may be a surface of a silicon wafer, or more preferably a layer of dielectric material. Generally, the base anchors are preferably positioned in such a manner that an imaginary first line 120 connecting respective portions of the first base anchor 112 and the third base anchor 116 is substantially parallel to a second imaginary line 122 connecting respective portions of the second base anchor 114 and the fourth base anchor 118. Similarly, the base anchors are preferably positioned in such a manner that an imaginary third line 124 connecting respective portions of the first base anchor 112 and the second base anchor 114 is substantially parallel to a fourth imaginary line 126 connecting respective portions of the third base anchor 116 and the fourth base anchor 118. However, other orientations of the base anchors 112, 114, 116, 118 may be appropriate. Generally each of these base anchors 112, 114, 116, 118 protrudes from (i.e. extends out from) the base substrate 110 by a distance of at least about 1 micron, and preferably within a range of about 2 microns to about 6 microns. However, protrusion distances outside the preferred range may be appropriate. These base anchors 112, 114, 116, 118 (as well as all the components of suspension assembly 100) are generally made up of structural materials (e.g., such as polysilicon and/or silicon).

Each of the base anchors 112, 114, 116, 118 generally includes first and second anchor components (e.g., 112A and 112B of the first base anchor 112). While the following discussion is directed to the first and second anchor components 112A, 112B of the first base anchor 112, this following discussion is equally applicable to the structural and functional characteristics of base anchors 114, 116, and 118. The first and second anchor components 112A, 112B of the first base anchor 112 exhibit elliptical/ovoid cross-sectional configurations with the first anchor component 112A being more elongate than the second anchor component 112B. Other cross-sectional configurations for anchor components may be appropriate such as, but not limited to, circular, polygonal, and even multi-radial/multi-angular, cross-sections. While the first and second anchor components 112A, 112B may exhibit a variety of shapes, designs, and/or configurations, the first support anchor 112 preferably exhibits symmetry with respect to the other support anchors 114, 116, 118. As illustrated in FIG. 5, the first base anchor 112 is divided into first and second anchor components 112A, 112B to provide a benefit of reducing the potential for the attached support arm 136 to pivot about the first base anchor 112. While the first base anchor 112 is illustrated as having first and second anchor components 112A, 112B, the first base anchor 112 may be made up of a single anchor component or even more than two anchor components.

Figure 6:
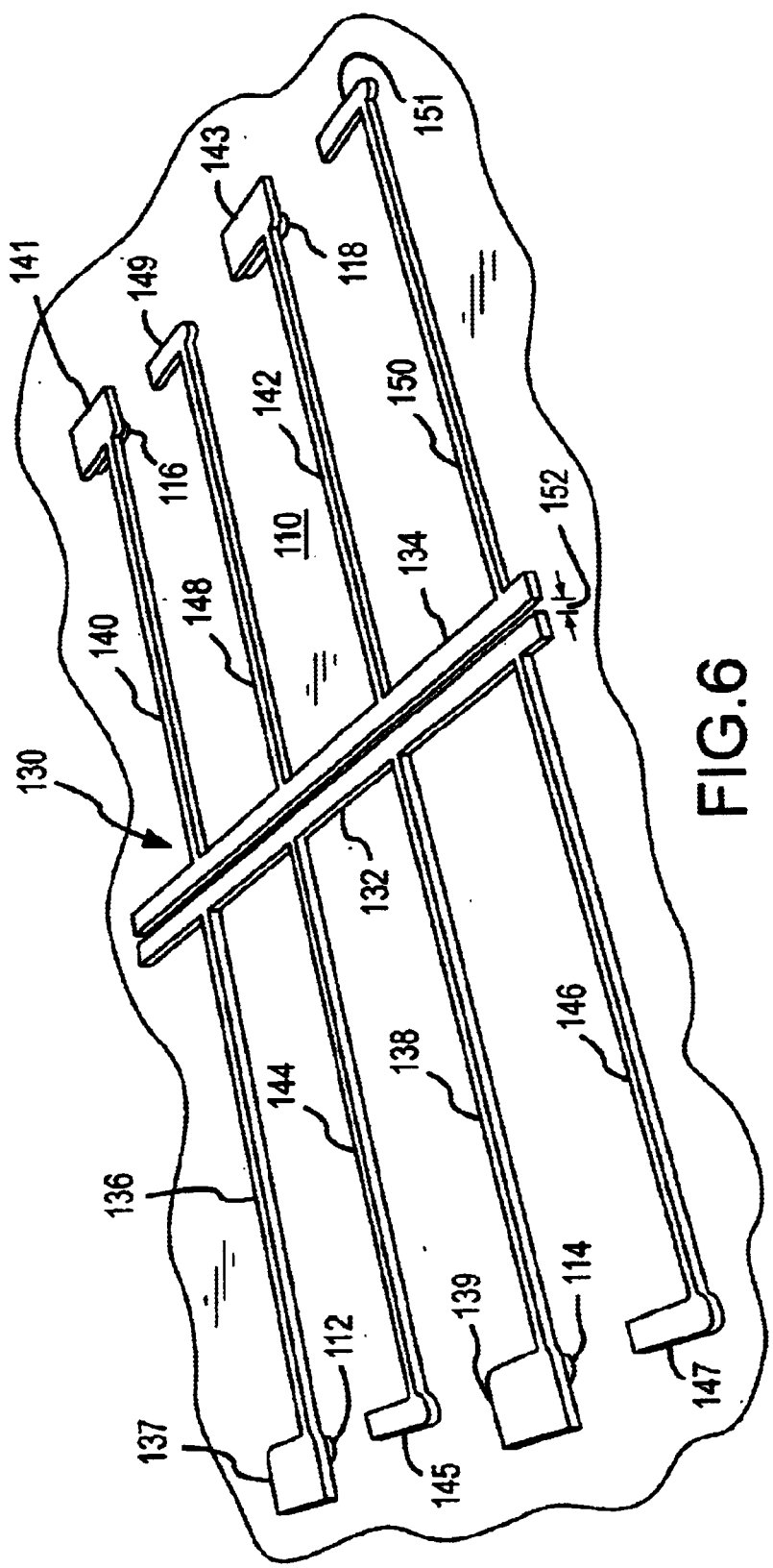
FIG. 6 is a perspective view of a first support structure of a suspension assembly interconnected with the base anchors of FIG. 5.

FIG. 6 shows a first support structure 130 of the suspension assembly 100 interconnected with the base substrate 110 via the base anchors 112, 114, 116, 118. This first support structure 130 includes first and second lower support rails 132, 134, which are longitudinally extending and generally parallel with one another. These first and second lower support rails 132, 134 are generally centrally located on the first support structure 130. These first and second lower support rails 132, 134 are generally separated by a distance 162 ranging from about 1 micron to about 10 microns, and preferably about 3 microns. However, a distance 152 of separation outside the disclosed range may be appropriate. While these first and second lower support rails 132, 134 are illustrated as being separated by the distance 152, some embodiments exhibit first and second lower support rails 132, 134 being joined to function as a single lower support rail unit. In such embodiments, the first and second lower support rails 132, 134 can be joined by any appropriate manner including, but not limited to, welding and clamping.

The first lower support rail 132 has first and second lower support arms 136, 138 attached thereto. In other words, the first and second lower support arms 136, 138 are interconnected with the first lower support rail 132. Preferably, the first and second lower support arms 136, 138 interconnect with the first lower support rail 132 in a substantially perpendicular fashion, although other interconnection angles are contemplated. The first and second lower support arms 136, 138 have corresponding first and second fixed ends 137, 139, which are remotely disposed from the first lower support rail 132. In other words, the first fixed end 137 of the first lower support arm 136 is generally opposite the end which connects to the first lower support rail 132, and, the second fixed end 139 of the second lower support arm 138 is generally opposite the end which connects to the first lower support rail 132. It is these first and second fixed ends 137, 139 of the respective first and second lower support arms 136, 138 that are interconnected with the base substrate 110 via the respective base anchors 112, 114. Put in functional language, the first fixed end 137 of the first lower support arm 136 and the second fixed end 139 of the second lower support arm 138 are anchored to the base substrate 110 to substantially prohibit movement of the first fixed end 137 of the first lower support arm 136 and the second fixed end 139 of the second lower support arm 138.

Similarly, the second lower support rail 134 has third and fourth lower support arms 140, 142 attached thereto, which are preferably interconnected with the second lower support rail 134 in a substantially perpendicular fashion, although other interconnection angles are contemplated. The third and fourth lower support arms 140, 142 have corresponding third and fourth fixed ends 141, 143, which are remotely disposed from the second lower support rail 134. That is, the third fixed end 141 of the first lower support arm 140 is generally opposite the end which connects to the second lower support rail 134, and the fourth fixed end 143 of the fourth lower support arm 142 is generally opposite the end which connects to the second lower support rail 134. It is these third and fourth fixed ends 141, 143 of the respective third and fourth lower support arms 140, 142 that are interconnected with the base substrate 110 via the respective base anchors 116, 118. Thus, the third fixed end 141 of the third lower support arm 140 and the fourth fixed end 143 of the fourth lower support arm 142 are anchored to the base substrate 110 to substantially prohibit movement of the third fixed end 141 of the third lower support arm 140 and the fourth fixed end 143 of the fourth lower support arm 142.

In addition to lower support arms 136, 138, the first lower support rail 132 also has first and second lower flex arms 144, 146 attached thereto. The first lower flex arm 144 of the first support structure 130 is interconnected with the first lower support rail 132 and disposed between the first and second lower support arms 136, 138, preferably so that the first lower flex arm 144 is substantially aligned with the first and second lower support arms 136, 138. In other words, the first lower flex arm 144 generally extends out from the first lower support rail 132 so that it is generally coplanar with the first and second lower support arms 136, 138, and preferably substantially parallel to the first and second lower support arms 136, 138. The second lower flex arm 146 is also connected with the first lower support rail 132. The second lower flex arm 146 is positioned in such a manner that the second lower support arm 138 is positioned between the first and second lower flex arms 144, 146,preferably so that the first and second lower flex arms 144, 146 and the first and second lower support arms 136, 138 exhibit a substantially coplanar relationship.

An entirety of each of the first and second lower flex arms 144, 146 is preferably separated from and avoids direct contact with the base substrate 110. In the context of functionality, the first and second lower flex arms 144, 146 are substantially unimpeded by any connection of the first and second lower flex arms 144, 146 to the base substrate 110. Thus, while the first and second lower support arms 136, 138 are interconnected with the base substrate 110 (e.g. via base anchors 112, 114), the first and second lower flex arms 144, 146 are able to move (e.g. pivot/flex about their respective connections to the first lower support rail 132) unimpeded by any link to the base substrate 110. Thus, a first free end 145 of the first lower flex arm 144 and a second free end 147 of the second lower flex arm 146 are remotely positioned with respect to the first lower support rail 132. In other words, the first and second free ends 145, 147 of the respective first and second lower flex arms 144, 146 are found opposite the respective ends of the respective first and second lower flex arms 144, 146 that are attached to the first lower support rail 132. As with the entireties of the first and second lower flex arms 144, 146, the first and second free ends 145, 147 of the respective first and second lower flex arms 144, 146 are separated from and avoid direct contact with the base substrate 110.

The second lower support rail 134 has third and fourth lower flex arms 148, 150 attached thereto. The third lower flex arm 148 of the first support structure 130 is interconnected with the second lower support rail 134 and disposed between the third and fourth lower support arms 140, 142, preferably so that the third lower flex arm 148 is substantially aligned with the third and fourth lower support arms 140, 142. In other words, the third lower flex arm 148 generally extends out from the second lower support rail 134 so that it is generally coplanar with the third and fourth lower support arms 140, 142, and preferably substantially parallel to these third and fourth lower support arms 140, 142. The fourth lower flex arm 150 is also connected with the second lower support rail 134. The fourth lower flex arm 150 is positioned in such a manner that the second lower support arm 142 is positioned between the third and fourth lower flex arms 148, 150, preferably so that the third and fourth lower flex arms 148, 150 and the third and fourth lower support arms 140, 142 exhibit a substantially coplanar relationship.

An entirety of each of the third and fourth lower flex arms 148, 150 is separated from and avoids direct contact with the base substrate 110. In the context of functionality, the third and fourth lower flex arms 148, 150 are substantially unimpeded by any connection of the third and fourth lower flex arms 148, 150 to the base substrate 110. Thus, while the third and fourth lower support arms 140, 142 are interconnected with the base substrate 110 (e.g. via base anchors 116, 118), the third and fourth lower flex arms 148, 150 are able to move (e.g. pivot/flex about their respective connections to the second lower support rail 134) unimpeded by any link to the base substrate 110. Thus, a third free end 149 of the third lower flex arm 148 and a fourth free end 151 of the fourth lower flex arm 150 are remotely positioned with respect to the second lower support rail 134. In other words, the third and fourth free ends 149, 151 of the respective third and fourth lower flex arms 148, 150 are found opposite the respective ends of the respective third and fourth lower flex arms 148, 150 that are attached to the second lower support rail 134. As with the entireties of the third and fourth lower flex arms 148, 150, the third and fourth free ends 149, 151 of the respective third and fourth lower flex arms 148, 150 are separated from and avoid direct contact with the base substrate 110.

Figure 7:
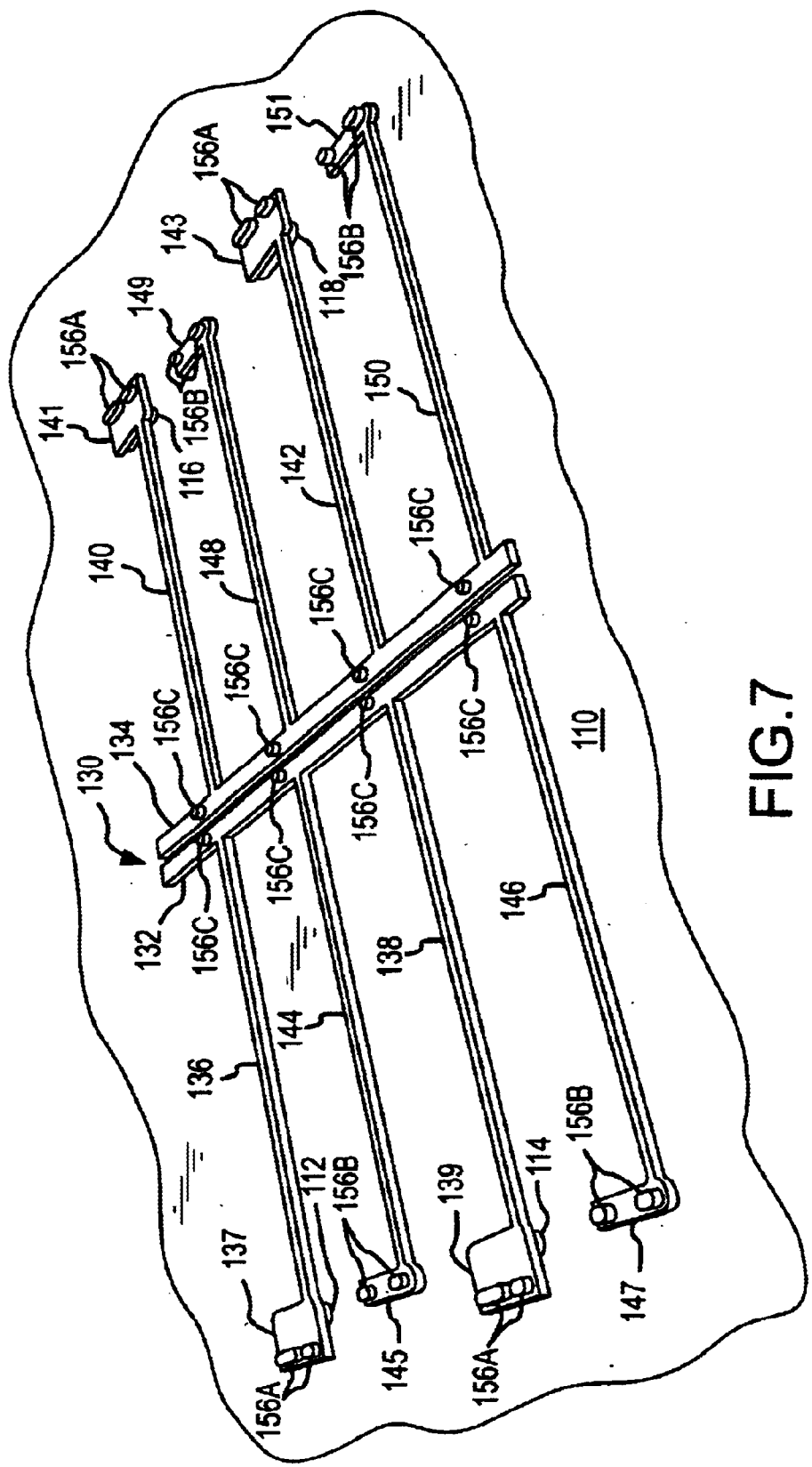
FIG. 7 is a perspective view of a first set of support anchors of a suspension assembly interconnected with the first support structure of FIG. 6.

FIG. 7 shows a plurality of intermediate support anchors 156 positioned on upper surfaces the first support structure 130. More specifically, two intermediate support anchors 156A are positioned on upper surfaces of each of the first, second, third, and fourth fixed ends 137, 139, 141, 143 of the respective first, second, third, and fourth lower support arms 136, 138, 140, 142. Thus, each of the first, second, third, and fourth fixed ends 137, 139, 141, 143 of the respective first, second, third, and fourth lower support arms 136, 138, 140, 142 is positioned between a respective first, second, third, and fourth base anchor 112, 114, 116, 118 and two intermediate support anchors 156A. In addition, two intermediate support anchors 156B are positioned on upper surfaces of each of the first, second, third, and fourth free ends 145, 147, 149, 151 of the respective first, second, third, and fourth lower flex arms 144, 146, 148, 150. Further, upper surfaces of each of the first and second lower support rails 132, 134 have four intermediate support anchors 156C. Generally, each of the intermediate support anchors 156 protrudes from (i.e. extends out from) the upper surface of the first support structure 130 by a distance of at least about 1 micron, and preferably within a range of about 2 microns to about 4 microns. However, protrusion distances outside these ranges may be appropriate. As with the base anchors 112, 114, 116, 118, the intermediate support anchors 156 are generally made up of structural materials (e.g., such as polysilicon and/or silicon).

The intermediate support anchors 156A, 156B generally exhibit elliptical/ovoid cross-sectional configurations, and the intermediate support anchors 156C generally exhibit circular cross-sectional configurations. However, other cross-sectional configurations for intermediate support anchors 156 may be appropriate such as, but not limited to, polygonal and even multi-radial/multi-angular cross-sections. As with the base anchors (e.g., 112), the intermediate support anchors 156A, 156B may be configured in pairs to provide a benefit of structural continuity with the base anchors 112, 114, 116, 118. While the intermediate support anchors 156A, 156B are illustrated as being positioned in groups of two, one or more of the intermediate support anchors 156A, 156B may be made up of a single anchor component or even more than two anchor components. Similarly, the number, design, and orientation of the intermediate support anchors 156C may vary from that of the embodiment of FIG. 7 when appropriate. Additionally, while any of the anchors (e.g., 112, 156A, 178A) herein discussed may exhibit a variety of shapes, designs, and/or configurations, circular or ovoid configurations provide a fabrication benefit of reduced surface depressions in the layer deposited over the cut (which serve as a "mold" of sorts for defining the structural characteristics of the resultant anchors). This generally assists in minimizing design constraints as the suspension assembly 100 is built up.

Figure 8:
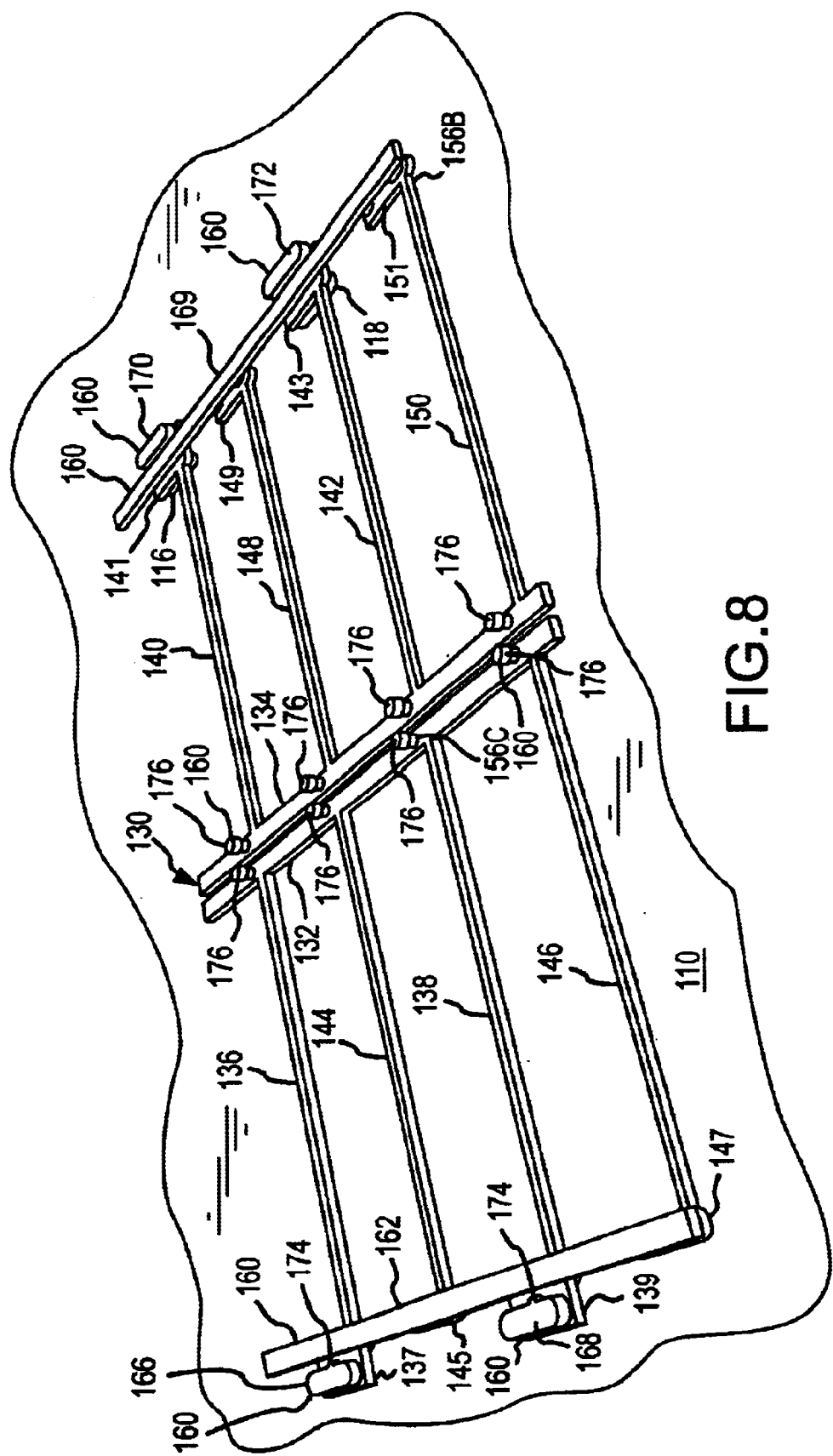
FIG. 8 is a perspective view of an intermediate actuation structure of a suspension assembly interconnected with the support anchors of FIG. 7.

FIG. 8 illustrates that the intermediate support anchors 156 are generally utilized to connect an intermediate actuation structure 160 to the first support structure 130. More specifically, the intermediate support anchors 156B are generally utilized to interconnect a first lateral rail 162 of the intermediate actuation structure 160 to the first and second free ends 145, 147 of the respective first and second lower flex arms 144, 146 of the first support structure 130. In a similar manner, the intermediate support anchors 156B are generally utilized to interconnect a second lateral rail 164 of the intermediate actuation structure 160 to the third and fourth free ends 149, 151 of the respective third and fourth lower flex arms 148, 150 of the first support structure 130. While the first and second lateral rails 162, 164 are illustrated as being interconnected to the appropriate free ends (e.g., 151) of the corresponding lower flex arms (e.g., 150), it is also important to note that the first and second lateral rails 162, 164 of the intermediate actuation structure 160 are free from attachment to any fixed ends (e.g., 143) of any corresponding lower support arms (e.g., 142). In other words, clearance (i.e., a space) exists between where the first lateral rail 162 overlies the first and second fixed ends 137, 139 of the respective first and second lower support arms 136, 138, and similarly, clearance exists between the second lateral rail 164 overlies the third and fourth extends 141, 143 of the respective third and fourth lower support arms 140, 142. These first and second lateral rails 162, 164 are generally elongate and have a length generally similar to that of the first and second lower support rails 132, 134 of the first support structure 130. In addition, these first and second lateral rails 162, 164 are generally parallel to one another as well as substantially parallel to the first and second lower support rails 132, 134 of the first support structure 130.

Still referring the FIG. 8, the intermediate support anchors 156A are generally utilized to interconnect a first fixed end support 166 of the intermediate actuation structure 160 to the first fixed end 137 of the first lower support rail 136 of the first support structure 130. Likewise, the intermediate support anchors 156A are generally utilized to interconnect a second fixed end support 168 of the intermediate actuation structure 160 to the second fixed end 139 of the second lower support rail 138 of the first support structure 130. In a similar manner, the intermediate support anchors 156A are generally utilized to interconnect third and fourth fixed end supports 170, 172 of the intermediate actuation structure 160 to the respective third and fourth fixed ends 141, 143 of the respective third and fourth lower support rails 140, 142 of the first support structure 130. Thus, each of the fixed ends (e.g., 137) of the corresponding lower support rails (e.g., 136) of the first support structure 130 are generally positioned between intermediate support posts 156A of the intermediate actuation structure 160 and corresponding base anchors (e.g., 112). Each of the fixed end support 166, 168, 170, 172 includes an outcropping 174 that extends from a side surface that faces the corresponding lateral rail 162 or 164. This outcropping 174 minimizes the potential amount of friction and/or stiction due to surface-to-surface contact/ rubbing between each fixed end support (e.g., 168) and the corresponding adjacent lateral rail (e.g., 162). While each of these fixed end supports 166, 168, 170, 172 is illustrated as being substantially oblong, other designs/configurations of these fixed end supports are contemplated since these fixed end supports 166, 168, 170, 172 generally provide a support function rather than any substantial moving/actuational function.

The intermediate actuation structure 160 illustrated in FIG. 8 also includes a plurality of intermediate support posts 176. Each of these intermediate support posts 176 of the intermediate actuation structure 160 is positioned atop of a corresponding intermediate support anchor 156C. In addition, each of these intermediate support posts 176 are interconnected with one of the first and second lower support rails 132, 134 of the first support structure 130 via the corresponding intermediate support anchor 156C. These intermediate support posts 176 are generally cylindrical in configuration and are illustrated as having greater diameters than the intermediate support anchors 156C disposed below. However, other configurations (i.e., designs) of the intermediate support posts 176 may be appropriate such as, but not limited to, utilizing different shape(s) and/or changing the size of the intermediate support posts 176 with respect to the intermediate support anchors 156C.

Figure 9A:
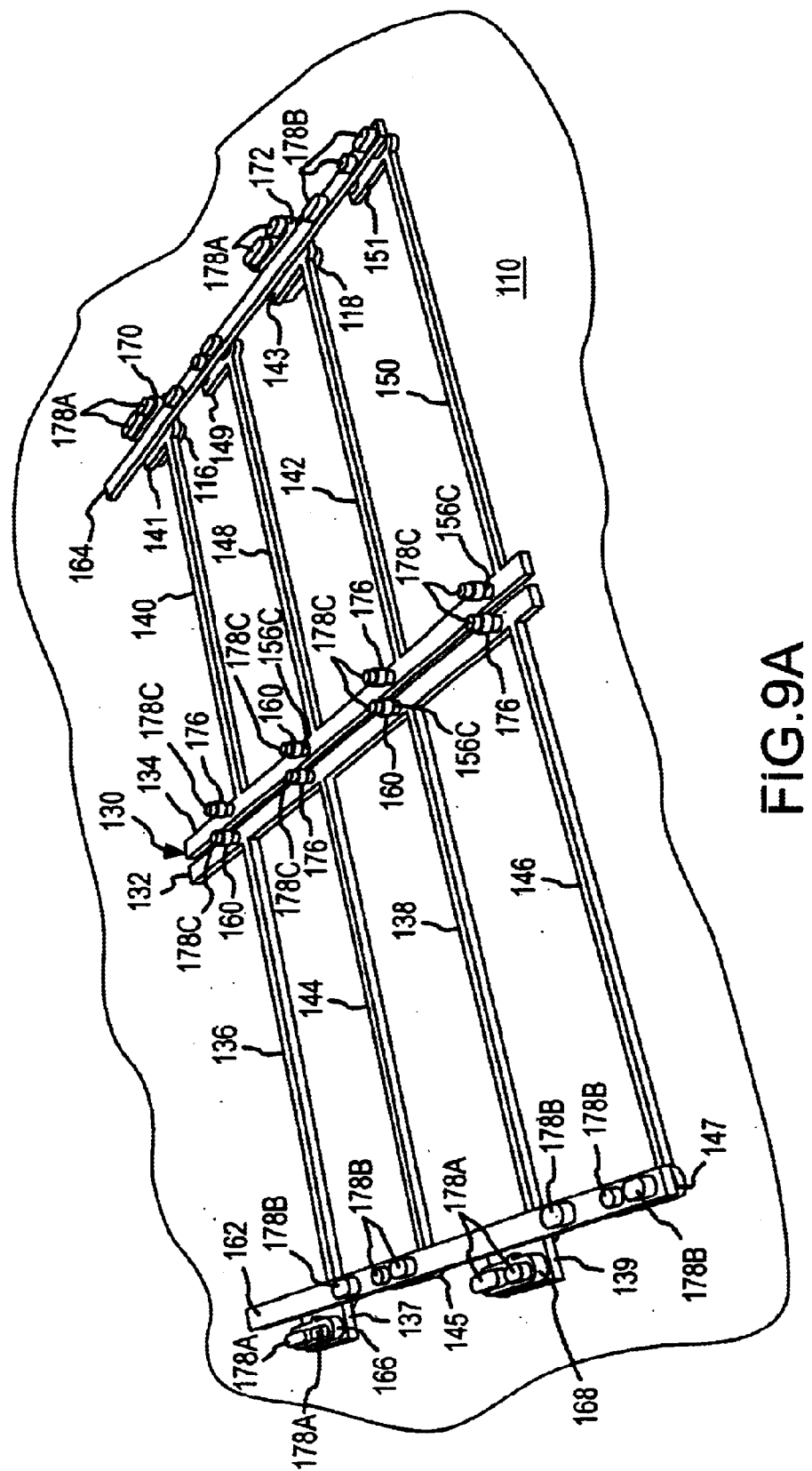
FIG. 9A is a perspective view of a second set of support anchors of a suspension assembly interconnected with the intermediate actuation structure of FIG. 8.

FIG. 9A shows a plurality of actuation support anchors 178 positioned on upper surfaces the intermediate actuation structure 160. More specifically, two fixed intermediate support anchors 178A are positioned on upper surfaces of each of the first, second, third, and fourth fixed end supports 166, 168, 170, 172 of the intermediate actuation structure 160. Thus, each of the first, second, third, and fourth fixed end supports 166, 168, 170, 172 of the intermediate actuation structure 160 is positioned between two actuation support anchors 178A and two intermediate support anchors 156A. In addition, six actuation support anchors 178B are positioned on upper surfaces of each of the first and second lateral rails 162, 164. The actuation support anchors 178B are positioned on the first lateral rail 162 in such a manner that a pair of the actuation support anchors 178B overlies not only the first lateral rail 162 but also a pair of intermediate support anchors 156 and the first free end 145 of the first lower flex arm 144. Similarly, a pair of the actuation support anchors 178B is arranged so that they overlie the first lateral rail 162, a pair of the intermediate support anchors 156, and the second free end 147 of the second lower flex arm 146. Likewise, pairs of the actuation support anchors 178B are positioned on the second lateral rail 164 in such a manner that each pair overlies not only the second lateral rail 164 but also a corresponding pair of intermediate support anchors 156 and one of the third and fourth free ends 149, 151 of the respective third and fourth lower flex arms 148, 150. Further, an actuation support anchor 178C is positioned atop an upper surface of each of the intermediate support posts 176 of the intermediate actuation structure 160. Generally, each of these actuation support anchors 178 protrudes from (i.e. extends out from) the corresponding upper surface of the intermediate actuation structure 160 by a distance of at least about 1 micron, and preferably within a range of about 2 microns to about 4 microns. However, protrusion distances outside these ranges may be appropriate.

The actuation support anchors 178 generally exhibit elliptical/ovoid or circular cross-sectional configurations. However, other cross-sectional configurations for the actuation support anchors 178 may be appropriate such as, but not limited to, polygonal and even multi-radial/multi-angular cross-sections. While six actuation support anchors 178B are illustrated atop each lateral rail (e.g., 162), and while two actuation support anchors 178A are illustrated atop each fixed end support (e.g., 168), the number and positioning of the actuation support anchors 178A, 178B may vary where appropriate. Similarly, the number, design, and size of the actuation support anchors 178C may vary from that of the embodiment of FIG. 9A when appropriate.

Figure 9B:
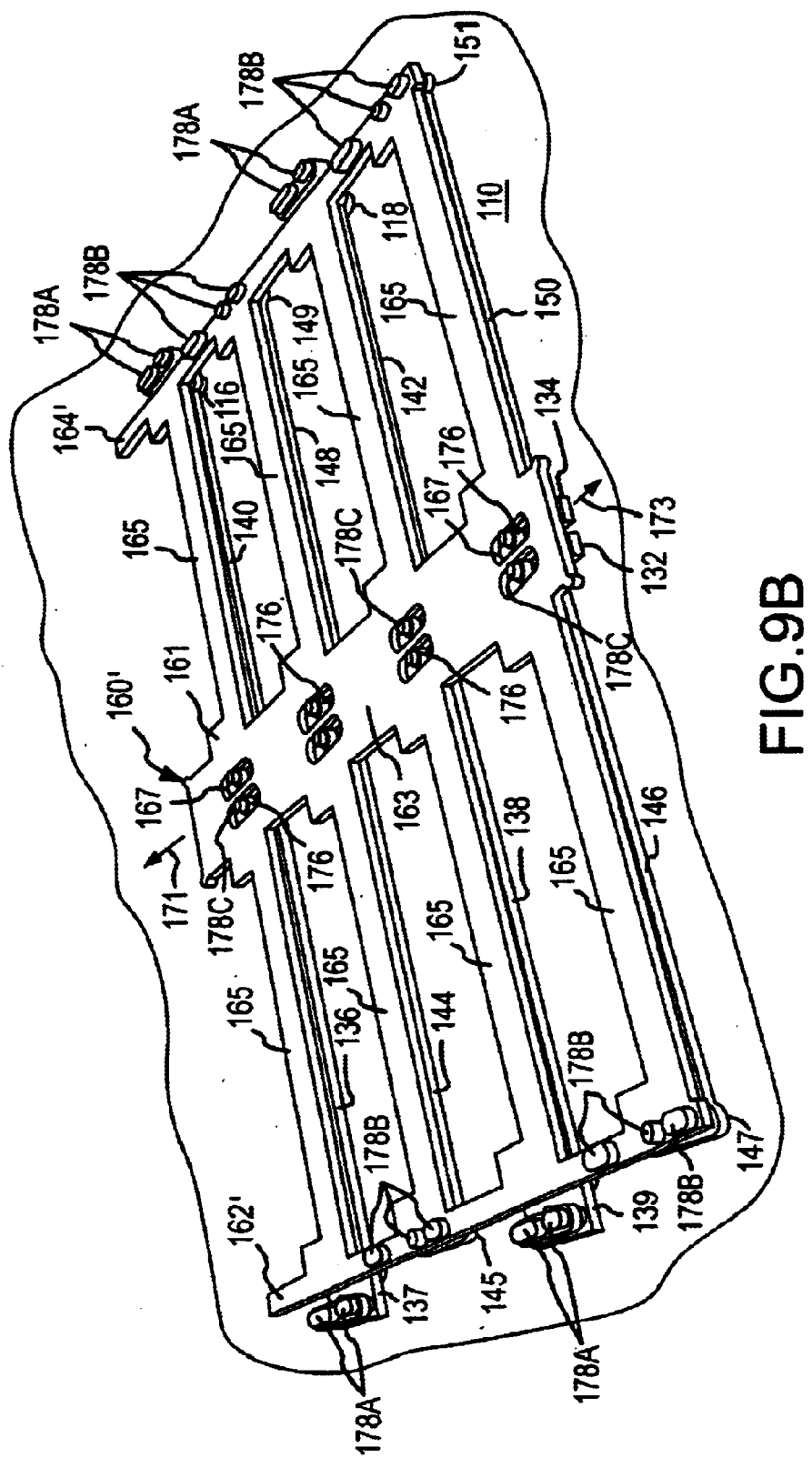
FIG. 9B is a perspective view of a second set of support anchors of a suspension assembly interconnected with a full-support variation of the intermediate actuation structure of FIG. 8.

FIG. 9B illustrates actuation support anchors 178 positioned atop a variation of the intermediate actuation structure 160 of FIG. 9A, and as such, a "single prime" designation is used to identify the intermediate actuation structure 160'. Generally, the differences between the FIG. 9A embodiment and the FIG. 9B embodiment include the first and second lateral rails 162', 164' being connected to each other as components of a framework 161. This framework 161 includes a central intermediate support rail 163 and a plurality of intermediate support beams 165, which are generally oriented substantially perpendicularly to the first and second lateral rails 162', 164'. The central intermediate support rail 163 includes a number of actuation channels 167, the sides of which surround the intermediate support posts 176. However, these actuation channels 167 have an oblong design to allow enough clearance for movement of the framework 161 at least in one of the directions indicated by arrows 171, 173.

Figure 10A:
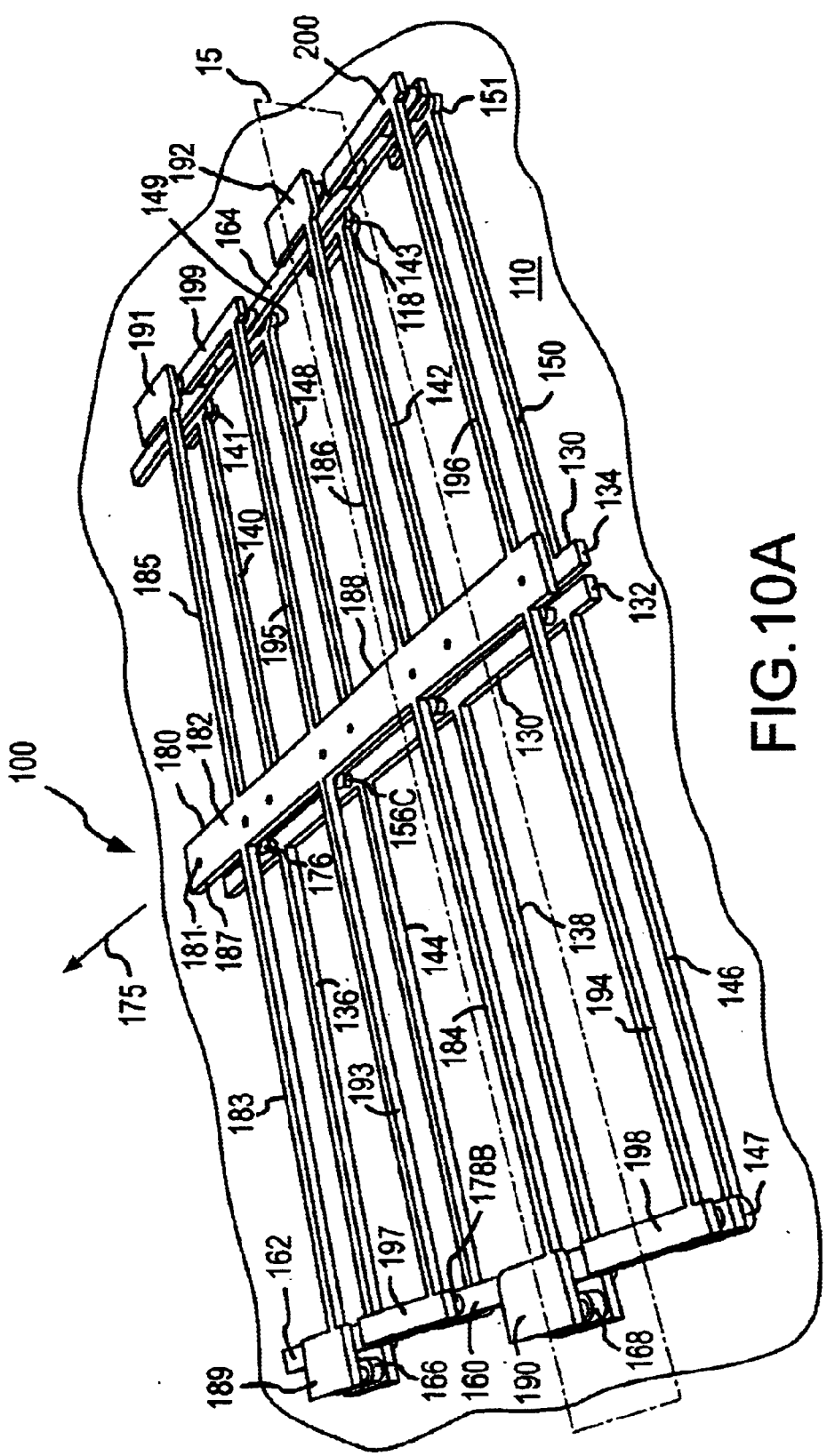
FIG. 10A is a perspective view of a suspension assembly including the intermediate actuation structure of FIG. 9A.
Figure 11:
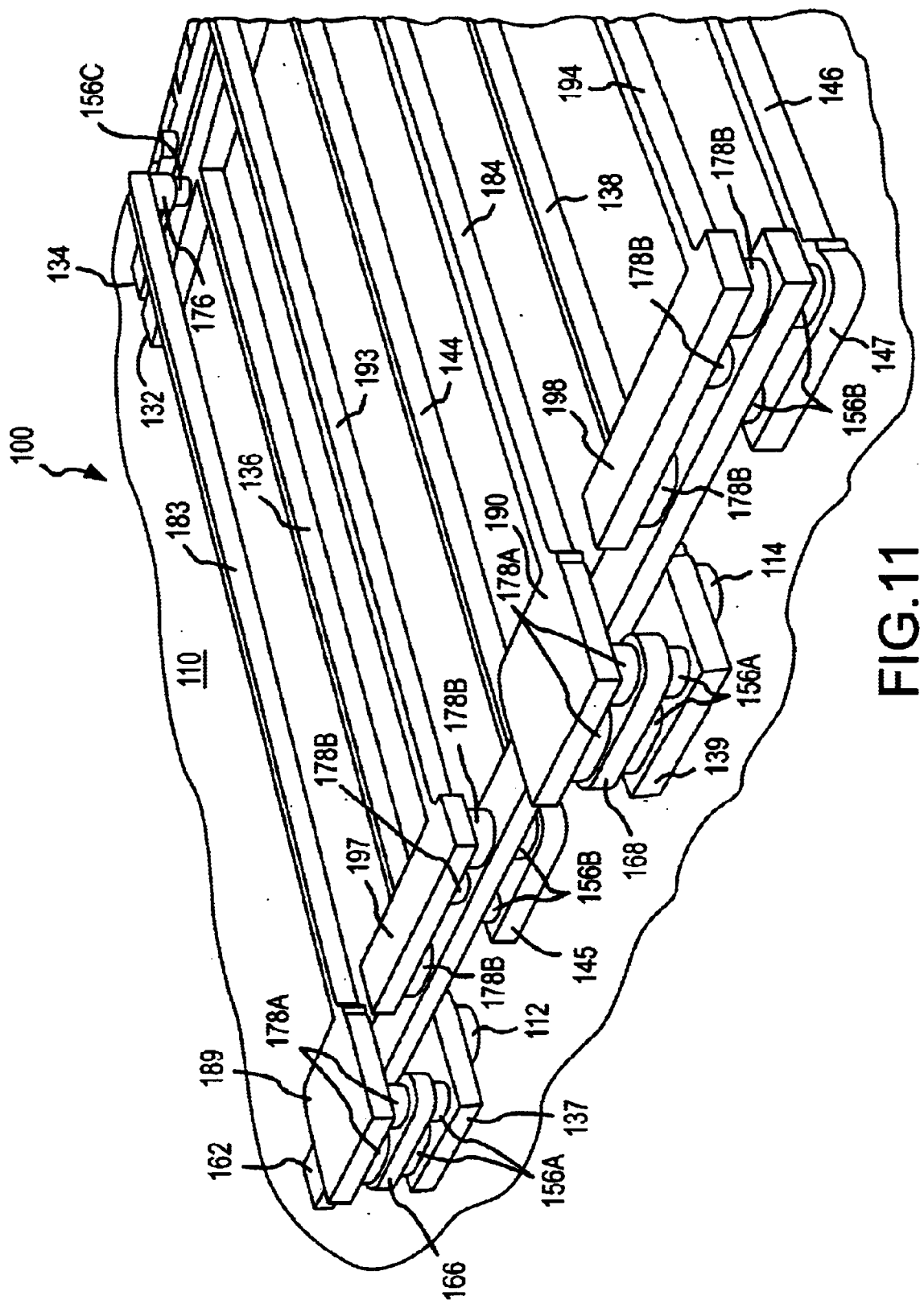
FIG. 11 is a perspective view of a lateral portion of the suspension assembly of FIG. 10A.
Figure 12:
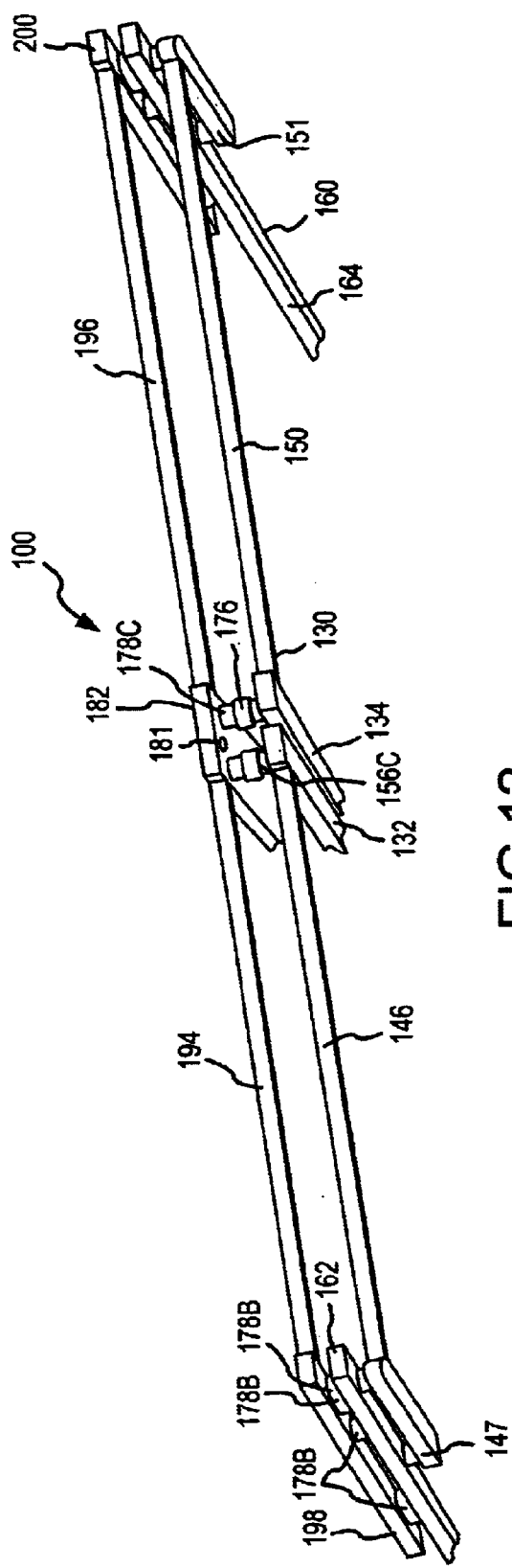
FIG. 12 is a perspective view of an end portion of the suspension assembly of FIG. 10A with the base substrate removed.

FIGS. 10A, 11, and 12 show an embodiment of a suspension assembly 100 made up of the structure illustrated in FIG. 9A plus a second support structure 180. This second support structure 180 is positioned above the intermediate actuation structure 160 of the suspension assembly 100 so that the intermediate actuation structure 160 is positioned between the second support structure 180 and the first support structure 130 of the suspension assembly 100. The second support structure 180 has a first upper support rail 182 interconnected with the intermediate actuation structure 160 via the actuation support anchors 178C. This first upper support rail 182 is longitudinally extending and generally overlies the first and second lower support rails 132, 134 of the first support structure 130. Thus, the first upper support rail 182 is generally centrally located on the second support structure 180. In addition, this first upper support rail 182 is generally parallel with the first and second lower support rails 132, 134 of the first support structure 130. The first upper support rail 182 also has a plurality of apertures 181 disposed therein and extending from an upper surface to a lower surface of the first upper support rail 182. These apertures 181 are included to provide a beneficial function of enabling a release etchant to sufficiently contact and remove sacrificial materials during fabrication of the suspension assembly 100. While the first upper support rail 182 is illustrated as a single support rail unit, some embodiments have the configuration of the first upper support rail 182 interchanged with the configurations of the first and second lower support rails 132, 134. In other words, some variations have the first upper support rail 182 divided into first and second upper support rails, and the first and second lower support rails 132, 134 joined together as a single support rail unit. Accordingly, the upper support rail 182 and/or the combination of the first and second lower support rails 132, 134 may be joined together to function as single, solitary support rail unit.

A first side 187 of the first upper support rail 182 has first and second upper support arms 183, 184 attached thereto and extending therefrom. In other words, the first and second upper support arms 183, 184 are connected to the first upper support rail 182. Preferably, the first and second upper support arms 183, 184 connect with the first upper support rail 182 in a substantially perpendicular fashion, although other connection angles are contemplated. In addition, these first and second upper support arms 183, 184 of the second support structure 180 are generally parallel with and vertically spaced from corresponding first and second lower support arms 136, 138 of the first support structure 130.

These first and second upper support arms 183, 184 have corresponding first and second fixed ends 189, 190, which are remotely disposed from the first upper support rail 182. In other words, the first fixed end 189 of the first upper support arm 183 is generally opposite the end which connects to the first upper support rail 182, and, the second fixed end 190 of the second upper support arm 184 is generally opposite the end which connects to the first upper support rail 182. It is these first and second fixed ends 189, 190 of the respective first and second upper support arms 183, 184 that are interconnected with the first and second fixed end supports 166, 168 of the intermediate actuation structure 160 via the actuation support anchors 178A. Put in functional language, the first fixed end 189 of the first upper support arm 183 and the second fixed end 190 of the second upper support arm 184 (like the corresponding fixed ends of the first and second lower support arms 136, 138) are interconnected with the base substrate 110 to substantially prohibit movement of the first fixed end 189 of the first upper support arm 183 and the second fixed end 190 of the second upper support arm 184.

Similarly, a second side 188 of the first upper support rail 182 has third and fourth upper support arms 185, 186 attached thereto and extending therefrom. These third and fourth upper support arms 185, 186 are preferably connected to the first upper support rail 182 in a substantially perpendicular fashion, although other interconnection angles are contemplated. In addition, these third and fourth upper support arms 185, 186 of the second support structure 180 are generally parallel with and vertically spaced from corresponding third and fourth lower support arms 140, 142 of the first support structure 130.

The third and fourth upper support arms 185, 186 have corresponding third and fourth fixed ends 191, 192, which are remotely disposed from the first upper support rail 182. That is, the third fixed end 191 of the first upper support arm 185 is generally opposite the end which connects to the first upper support rail 182, and the fourth fixed end 192 of the fourth upper support arm 186 is generally opposite the end which connects to the first upper support rail 182. These third and fourth fixed ends 191, 192 of the respective third and fourth upper support arms 185, 186 are interconnected with the respective third and fourth fixed end supports 170, 172,via the actuation support anchors 178A. Thus, the third fixed end 191 of the third upper support arm 185 and the fourth fixed end 192 of the fourth upper support arm 186 are also indirectly anchored to the base substrate 110 to substantially prohibit movement of the third fixed end 191 of the third upper support arm 185 and the fourth fixed end 192 of the fourth upper support arm 186.

In addition to upper support arms 183, 184, the first upper support rail 182 also has first and second upper flex arms 193, 194 attached thereto. The first upper flex arm 193 of the second support structure 180 is connected to the first upper support rail 182 and disposed between the first and second upper support arms 183, 184, preferably so that the first upper flex arm 193 is substantially aligned with the first and second upper support arms 183, 184. In other words, the first upper flex arm 193 generally extends out from the first upper support rail 182 so that it is generally coplanar with the first and second upper support arms 183, 184, and preferably substantially parallel to the first and second upper support arms 183, 184. The second upper flex arm 194 is also connected with the first upper support rail 182. The second upper flex arm 194 is positioned in such a manner that the second upper support arm 184 is positioned between the first and second upper flex arms 193, 194, preferably so that the first and second upper flex arms 193, 194 and the first and second upper support arms 183, 184 exhibit a substantially coplanar relationship. In addition, these first and second upper flex arms 193, 194 of the second support structure 180 are generally parallel with and vertically spaced from corresponding first and second lower flex arms 144, 146 of the first support structure 130.

The first and second upper flex arms 193, 194 are substantially unimpeded by any connection of these first and second upper flex arms 193, 194 to the base substrate 110. Thus, while these first and second upper flex arms 193, 194 are interconnected with the first and second lower flex arms 144, 146, the first and second upper flex arms 193, 194 are able to move (e.g. pivot/flex about their respective connections to the first upper support rail 182) unimpeded by any link to the base substrate 110. Thus, a first free end 197 of the first upper flex arm 193 and a second free end 198 of the second upper flex arm 194 are remotely positioned with respect to the first upper support rail 182. In other words, the first and second free ends 197, 198 of the respective first and second upper flex arms 193, 194 are found opposite the respective ends of the respective first and second upper flex arms 193, 194 that are attached to the first upper support rail 182. As with the entireties of the first and second upper flex arms 193, 194, the first and second free ends 197, 198 of the respective first and second upper flex arms 193, 194 are separated from and avoid direct contact with the base substrate 110.

The first upper support rail 182 also has third and fourth upper flex arms 195, 196 attached thereto. The third upper flex arm 195 of the second support structure 180 is connected to the second side 188 of the first upper support rail 182 and disposed between the third and fourth upper support arms 185, 186, preferably so that the third upper flex arm 195 is substantially aligned with the third and fourth upper support arms 185, 186. In other words, the third upper flex arm 195 generally extends out from the second side 188 of the first upper support rail 182 so that it is generally coplanar with the third and fourth upper support arms 185, 186, and preferably substantially parallel to these third and fourth upper support arms 185, 186. The fourth upper flex arm 196 is also connected to the second side 188 of the first upper support rail 182. The fourth upper flex arm 196 is positioned in such a manner that the fourth upper support arm 186 is positioned between the third and fourth upper flex arms 195, 196, preferably so that the third and fourth upper flex arms 195, 196 and the third and fourth upper support arms 185, 186 exhibit a substantially coplanar relationship. In addition, these third and fourth upper flex arms 195, 196 of the second support structure 180 are generally parallel with and vertically spaced from corresponding third and fourth lower flex arms 148, 150 of the first support structure 130.

The third and fourth upper flex arms 195, 196 are substantially unimpeded by any interconnection to the base substrate 110. Thus, the third and fourth upper flex arms 195, 196 are able to move (e.g. pivot/flex about their respective connections to the first upper support rail 182) unimpeded by any link to the base substrate 110. Thus, a third free end 199 of the third upper flex arm 195 and a fourth free end 200 of the fourth upper flex arm 196 are remotely positioned with respect to the first upper support rail 182. In other words, the third and fourth free ends 199, 200 of the respective third and fourth upper flex arms 195, 196 are found opposite the respective ends of the respective third and fourth upper flex arms 195, 196 that are attached to the first upper support rail 182. As with the entireties of the third and fourth upper flex arms 195, 196, the third and fourth free ends 199, 200 of the respective third and fourth upper flex arms 195, 196 are separated from and avoid direct contact with the base substrate 110.

The suspension assembly 100 of FIG. 10A functions by having an electrostatic element (not shown) attached to at least one of the first and second lateral rails 162, 164 of the intermediate actuation structure 160. In response to an electrostatic force urging one or both the first and second lateral rails 162, 164 in a direction indicated by arrow 175, the support rails (e.g., 132, 134, 182) are drawn in the direction indicated by arrow 175. The suspension assembly 100 resists the electrostatic force by not only a bending of the upper flex arms 193, 194, 195, 196 and the lower flex arms 144, 146, 148, 150, but also a stretching of the upper and lower support arms 183, 184, 185, 186, 136, 138, 140, 142. This stretching of the upper and lower support arms 183, 184, 185, 186, 136, 138, 140, 142 is a function of each of the support arms being "doubly clamped". That is, each of the support arms is either directly or indirectly anchored to the base substrate 110 and connected to a corresponding support rail (e.g., 132, 134, 182). Thus, the electrostatic force that urges one or both the first and second lateral rails 162, 164 in a direction indicated by arrow 175 also pulls the support rails (e.g., 132, 134, 182) in that direction 175. Since the support rails (e.g., 132, 134,182) do not allow for any lateral movement perpendicular to the direction arrow 175 (because the support arms (e.g., 184, 186) are anchored to the base substrate 110), the support arms are forced to stretch in response to the electrostatic force urging the first and second lateral rails 162, 164 in the direction of arrow 175. Accordingly, this stretching enables the suspension assembly 100 to urge the electrostatic element affixed to the suspension assembly 100 in an opposite direction of arrow 175 utilizing an elastic property of the suspension assembly 100 based on, at least in part, the tensile strength of the structural materials which made up the support arms (e.g., 184, 186).

A benefit of the configuration of the suspension assembly 100 is that utilizing both the first and second support structures 130, 180 in the suspension assembly 100 tends to provide a vertical support component (i.e., prevents the assembly 100 from bowing, bending, or the like toward the substrate 110) that resists substantial malformation of the assembly 100 due to the substrate 110 effecting a vertically directed electrostatic force of attraction (i.e., pulling down) on the suspension assembly 100. In addition, use of both the first and second support structures 130, 180 may also provide a vertical support component that resists substantial malformation of the suspension assembly 100 due to the substrate 110 effecting a vertically directed repulsive force (i.e., pushing up or away) on the suspension assembly 100. However, variations of the suspension assembly 100 of FIG. 10A are contemplated wherein one of the first and second support structures 130, 180 is not included in the structure of the suspension assembly 100. For example, in a suspension assembly that lacks a first support structure 130, base anchors (e.g., 112, 114, 116, 118) may be positioned between the base substrate (e.g., 110) and the respective fixed end supports (e.g., 166, 168, 170, 172) of the intermediate actuation structure (e.g., 160). In other words, the fixed end supports of the intermediate actuation structure may be interconnected to the base substrate via the base anchors. Thus, as well as having no first support structure 130, this embodiment may also be devoid of one or more of the intermediate support anchors 156, intermediate support posts 176, and intermediate support anchors 178C. Additionally, the base anchors generally have a height great enough to provide clearance between the base substrate (e.g., 110) and the first and second lateral rails (e.g., 162, 164). Put in functional language, the first and second lateral rails are generally separated from the base substrate by a distance that allows movement/actuation of the first and second lateral rails in the direction indicated by arrow 175 without contacting the base substrate.

In the variation of the suspension assembly 100 of FIG. 10A that lacks a second support structure 180, the first and second lower support rails 132, 134 are generally joined together to form a single, solitary, lower support rail. In addition, this variation of the suspension assembly may be devoid of one or more of the actuation support anchors 178, fixed end supports 166, 168, 170, 172, intermediate support posts 176, and intermediate support anchors 156A, 156C.

Figure 10B:
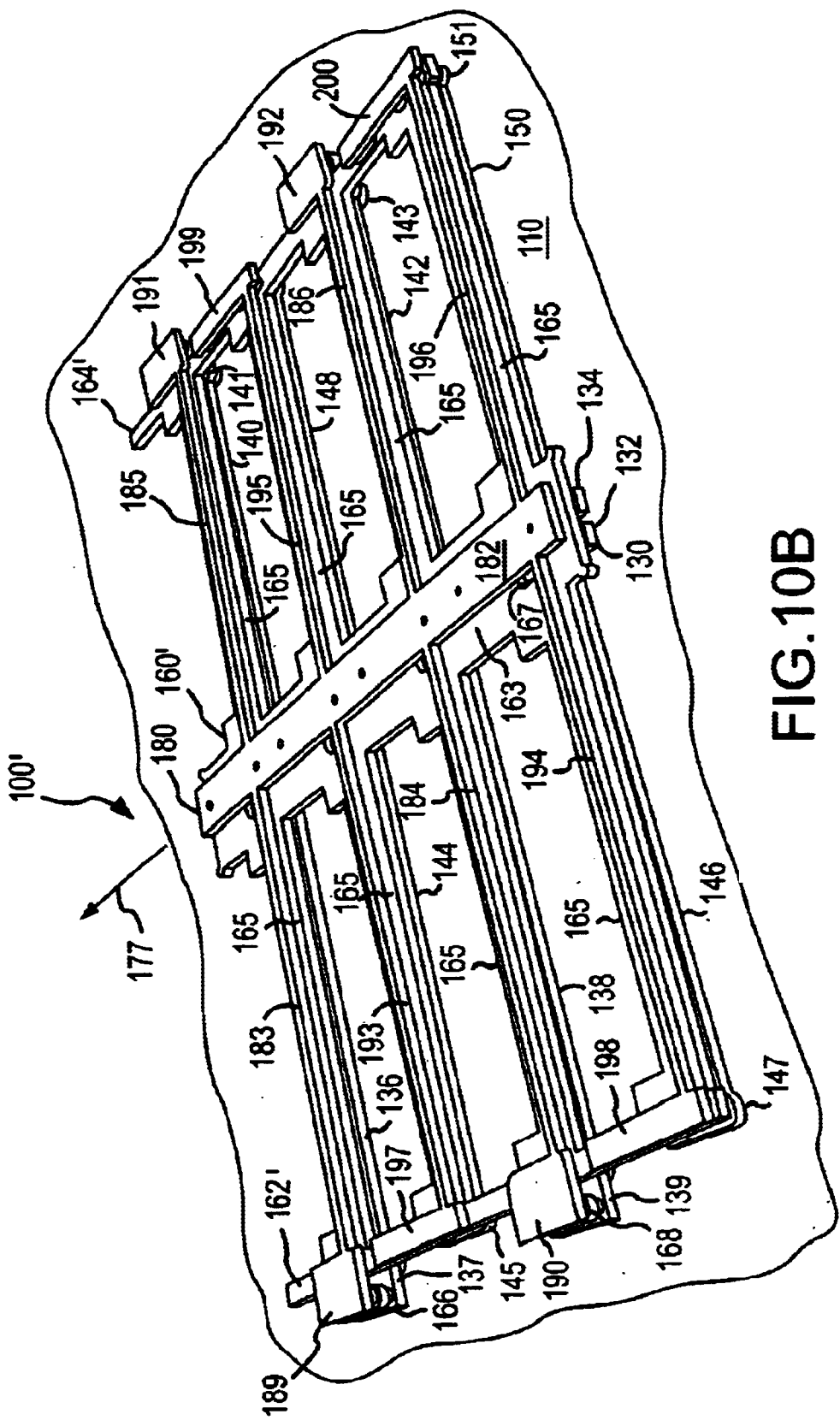
FIG. 10B is a perspective view of a suspension assembly including the intermediate actuation structure of FIG. 9B.

FIG. 10B shows a variation of the suspension assembly 100 of FIG. 10A, and as such, a "single prime" designation is used to identify the suspension assembly 100. Generally, the differences between the FIG. 10A embodiment and the FIG. 10B embodiment substitutes the intermediate actuation structure 160' having the framework 161 of FIG. 9B for the intermediate actuation structure 160 of FIG. 9A. As a structural benefit, this intermediate actuation structure 160' has a greater surface area that the intermediate actuation structure 160, thus providing more potential area to attach one or more electrostatic elements (e.g., comb structures) to. As a functional benefit, the support beams 165 of the framework 161 maintain a constant spacing between opposite free ends (e.g., 190, 192) of corresponding flex arms (e.g., 184, 186). Thus, in response to an electrostatic force urging the framework 161 in a direction indicated by arrow 177, the suspension assembly 100 resists the electrostatic force by not only by a stretching of the upper and lower support arms 183, 184, 185, 186, 136, 138, 140, 142, but also by a stretching of the upper and lower flex arms 144, 146, 148, 150, 193, 194, 195, 196. This additional stretching of the upper and lower flex arms 144, 146, 148, 150, 193, 194, 195, 196 is a function of each of the flex arms being anchored to the framework 161 and connected to a corresponding support rail (e.g., 132, 134, 182). Thus, the electrostatic force that urges the framework 161 in a direction indicated by arrow 177 also pulls the support rails (e.g., 132, 134, 182) in that direction 177 (however, maybe only about half the distance). The support beams 165 of the framework 161 do not allow for any significant lateral movement of the free ends of the flex arms perpendicular to the direction arrow 177 (such as during a bending movement) because the free ends 145, 147, 149, 151, 197, 198, 199, 200 of the respective flex arms (144, 146, 148, 150, 193, 194, 195, 196 are attached to the framework. Thus, the flex arms are also forced to stretch in response to the electrostatic force urging the framework 161 in the direction of arrow 177. Accordingly, this stretching enables the suspension assembly 100' to urge the electrostatic element affixed to the suspension assembly 100' in an opposite direction of arrow 177 utilizing an elastic property of the suspension assembly 100' based on, at least in part, the tensile strength of the structural materials which made up the support arms and the flex arms.

As is with the support assembly 100 of FIG. 10A, a benefit of the configuration of the suspension assembly 100' is that utilizing both the first and second support structures 130, 180 in the suspension assembly 100' tends to provide a vertical support component (i.e., prevents the assembly 100' from bowing, bending, or the like toward the substrate 110) that resists substantial malformation of the assembly 100' due to the substrate 110 effecting a vertically directed electrostatic force of attraction (i.e., pulling down) on the suspension assembly 100'. In addition, use of both the first and second support structures 130, 180 may also provide a vertical support component that resists substantial malformation of the suspension assembly 100' due to the substrate 110 effecting a vertically directed repulsive force (i.e., pushing up or away) on the suspension assembly 100'. However, variations of the suspension assembly 100' of FIG. 10B are also contemplated wherein one of the first and second support structures 130, 180 is not included in the structure of the suspension assembly 100'. For example, in a suspension assembly that lacks a first support structure 130, base anchors (e.g., 112, 114, 116, 118) may be positioned between the base substrate (e.g., 110) and the respective fixed end supports (e.g., 166, 168, 170, 172) of the intermediate actuation structure (e.g., 160'). In other words, the fixed end supports of the intermediate actuation structure are interconnected to the base substrate via the base anchors. Thus, as well as having no first support structure 130, this embodiment may also be devoid of intermediate support anchors 156, intermediate support posts 176, intermediate support anchors 178C, and actuation channels 167. Additionally, the base anchors generally have a height great enough to provide clearance between the base substrate (e.g., 110) and the framework (e.g., 161). Put in functional language, the framework is generally separated from the base substrate by distance that allows movement/actuation of the framework in the direction indicated by arrow 177 without contacting the base substrate.

In the variation of the suspension assembly 100' of FIG. 10B that lacks a second support structure 180, the first and second lower support rails 132, 134 are generally joined together to form a single, solitary, lower support rail. In addition, this variation of the suspension assembly may be devoid of one or more of the actuation support anchors 178, fixed end supports 166, 168, 170, 172, intermediate support posts 176, intermediate support anchors 156A, 156C, and actuation channels 167.

While the suspension assemblies 40, 100, and 100' have been illustrated as having alternating flex arms (e.g., 144) and support arms (e.g., 136), the flex and support arms may be arranged in a number of other configurations. One such configuration may include placing two or more flex arms (e.g., 144, 146) adjacent one another without having a support arm (e.g., 138) between them. Similarly, some embodiments may have a configuration that includes placing two or more support arms adjacent one another without having a flex arm between them. Thus, although it may be advantageous to utilize a suspension assembly having an equal number of flex and support arms, other variational embodiments may have a number of support arms that differs from the number of flex arms. In addition, while a support assembly (e.g., 100) is preferably symmetrical with respect to a central rail (e.g., 182), non-symmetrical embodiments are also contemplated. In other words, although the support assemblies 40, 100, and 100' are each illustrated as having a left side that is a "mirror image" of the right side, some variational embodiments may not exhibit such mirror image configurations.

Figure 13:
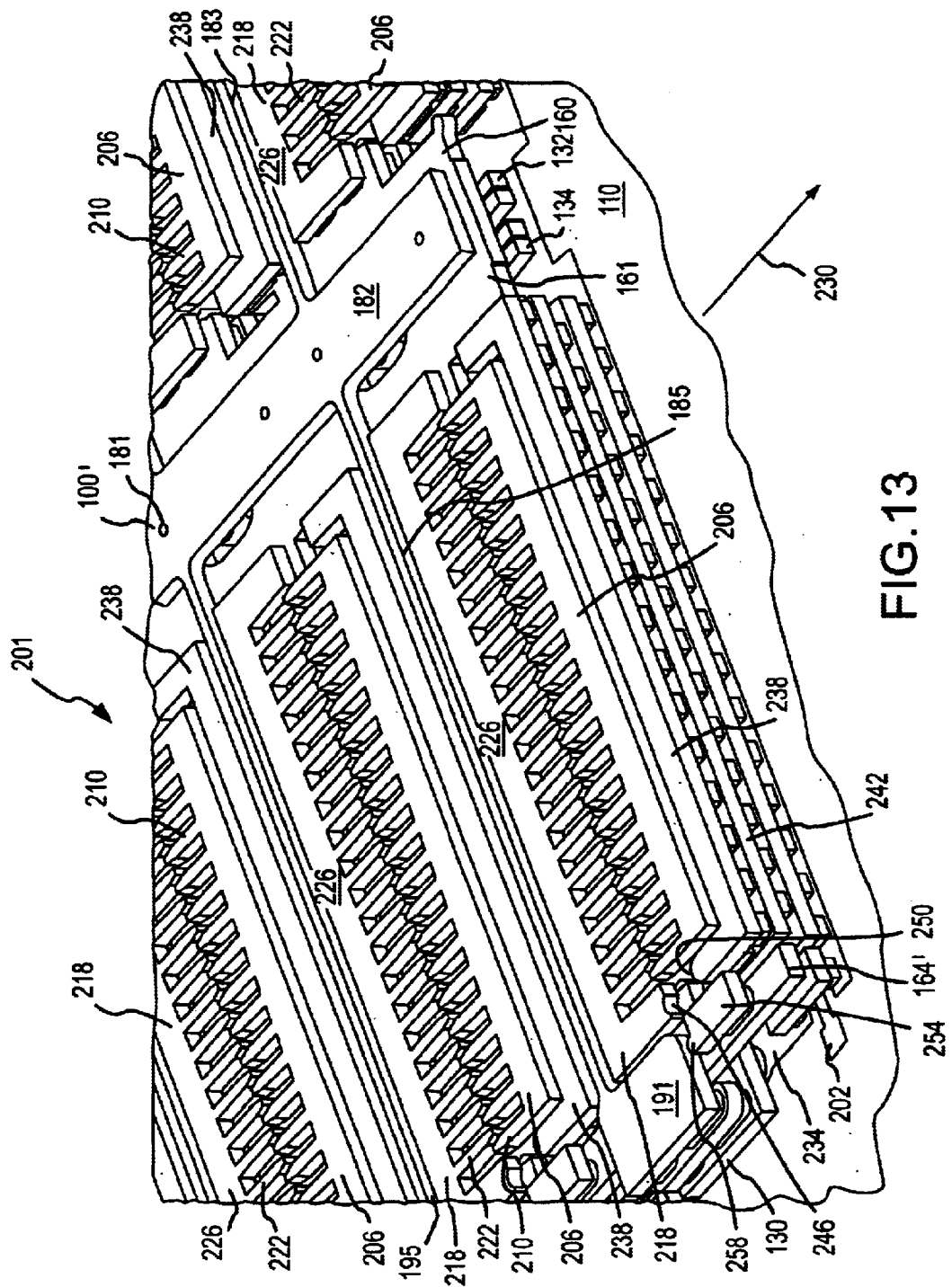
FIG. 13 is a perspective view of a suspension assembly interconnected with electrostatic elements and having the intermediate actuation structure illustrated in FIG. 9B.
Figure 14:
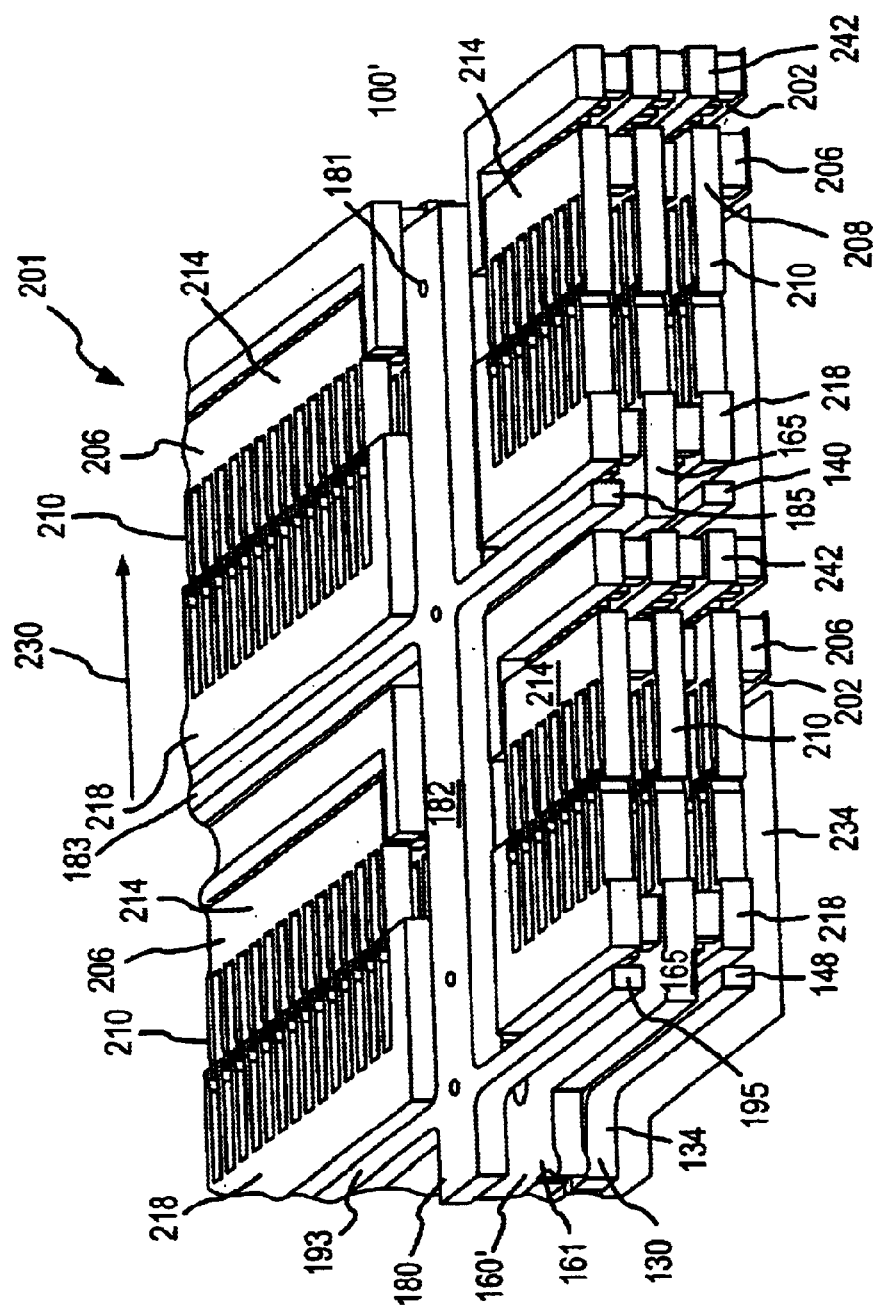
FIG. 14 is a cross-sectional view of the suspension assembly of FIG. 13 along cut line 14—14.

FIGS. 13 and 14 show an actuator assembly 201 including the suspension assembly 100' of FIG. 10B. More specifically, the actuator assembly 201 includes a plurality of electrostatic stationary comb assemblies 206, wherein each stationary comb assembly 206 has a plurality of stationary fingers 210 extending outward from a stationary beam 214. In addition, the framework 161 of the intermediate actuation structure 160' is interconnected with a plurality of movable comb assemblies 218, wherein each movable comb assembly 218 includes a plurality of moveable fingers 222 extending outward from a moveable beam 226. In FIGS. 13–14, the number of fingers 210, 222 has been simplified for clarity.

The actuator assembly 201 is illustrated in a non-actuated position (i.e., no voltage has been applied through an electrical distribution network 202). The stationary fingers 210 of each stationary comb assembly 206 are partially meshed (i.e. interdigitated to a predetermined extent of generally up to a few microns) with the moveable fingers 222 of a corresponding moveable comb assembly 218. Each stationary comb assembly 206 (as the name would indicate) is substantially unmovable. That is, each stationary comb assembly 206 is connected to and constantly set in a fixed position with respect to the base substrate 110. By contrast, each moveable comb assembly 218 is attached to a support beam 165 of the framework 161 of the intermediate actuation structure 160'. These support beams 165 generally have an elongate configuration such that the length of each support beam 165 is generally perpendicular to the movable fingers 222 and substantially parallel to the movable beams 226. However, other orientations of the support beams 165 with respect to one or both the movable fingers 222 and the movable beams 226 may be appropriate. In addition, each moveable comb assembly 218 is free from direct connection/contact with the first and second support structures 130, 180, as well as the base substrate 110. In other words, each of the moveable comb assemblies 218 is generally suspended above the base substrate 110 by the suspension assembly 100'. Thus, each moveable comb assembly 218 generally is attached to the intermediate actuation structure 160' at only one end of the moveable comb assembly 218 having the other end of the moveable comb assembly 218 being unsupported (i.e. cantilevered).

In addition to the suspension assembly 100', and the stationary and movable comb assemblies 206, 218, the actuator system 201 of FIGS. 13 and 14 generally includes at least one electrostatic shield assembly 238 generally positioned such that each stationary comb assembly 206 is positioned between a corresponding shield assembly 238 and a corresponding moveable comb assembly 218. These shield assemblies 238 are generally connected to the ground plane 234. In addition, the shield assemblies generally laterally (and optionally vertically) surround the lateral sides of each stationary beam 214 that does not have stationary fingers 210 attached thereto. Further, each of these shield assemblies 238 is generally configured such that an individual shield element 242 is paired with a corresponding stationary comb element 208. Use of these shield assemblies 238 ideally minimizes and/or eliminates unwanted electrostatic forces that may act contrary to the desired response of the actuator assembly 201. The design/configuration of each of the shield assemblies 238 may vary depending on, amongst other factors, the size and type of comb assemblies utilized in combination with the suspension assembly 100'.

Each moveable comb assembly 218 is equipped with a stop recess 246, and each shield assembly is equipped with a stop protrusion 250. The stop recess 246 and the stop protrusion 250 work in combination to prevent the moveable fingers 222 of each moveable comb assembly 218 from traveling too far in the direction indicated by arrow 230. In other words, the stop recess 246 and stop protrusion 250 prevent unwanted levels of interdigitation (e.g., unwanted "bottoming out" of a moveable comb assembly 218 against a corresponding stationary comb assembly 206). In addition, an actuation stop 254 is positioned atop the second lateral rail 164' to prevent the second support structure 180 from "over-actuating" and traveling a distance greater than the desired distance. This actuation stop 254 is generally coplanar with the second support structure 180 (and may be formed simultaneously with the second support structure 180 during a fabrication process). Further, the actuation stop 254 has an actuation protrusion 258 which extends out from a side of the actuation stop 254 which faces a side of the third fixed end 191 of the third upper support arm 185. This actuation protrusion 258 is generally rounded to minimize the potential contact surface of the actuation stop 254 with respect to the third fixed end of the third upper support arm 185. However, other shapes/configurations of the actuation protrusion 258 may be appropriate.

Generally, each of the movable comb assemblies 218 moves toward the corresponding stationary comb 206 in the direction indicated by arrow 230 in response to actuation voltage being applied to the stationary comb assemblies 206. Each stationary comb assembly 206 and corresponding moveable comb assembly 218 generally function as two electrodes that are capacitively coupled with one another. Upon application of a voltage across a capacitive gap between the stationary and moveable combs assemblies 206, 218, an electrostatic force is developed that attracts the moveable comb assembly 218 towards the corresponding stationary comb assembly 206. Movement of the moveable comb assemblies 218 in response to the electrostatic force results in a displacement (i.e., change in position) of the intermediate actuation structure 160'. Such a displacement can, for example, be transmitted through appropriate linkages and flexures to achieve a desired movement and/or positioning of a microstructure such as mirror of an optical switch. The electrostatic force, and thus the amount of displacement achieved, depends on (among other factors) the amount of voltage that is applied to the stationary comb assemblies 206. As may be appreciated, in order to achieve precise control of the electrostatic force generated and thus the displacement achieved, the amount of voltage applied must be controlled with precision. Generally, each stationary comb assembly 206 may carry a variable electrical potential (generally via the electrical distribution network 202) of up to about 200 Volts, while each moveable comb assembly 218 is generally maintained at ground electrical potential. Typically, the use of a ground plane 234 underlying the suspension assembly 100' (and thus, the moveable comb assemblies 218) at least assists in minimizing a downward electrostatic force of attraction which otherwise might tend to urge one or both the suspension assembly 100' and the movable comb assemblies 218 "down" towards the base substrate 110. In addition, utilization of two support structures (i.e., the first and second support structures 130, 180) also provides increased rigidity in the vertical plane that assists in combating the vertical forces exerted on one or both the suspension assembly 100' and the movable comb assemblies 218.

In an actuated position (not shown) caused by voltage being applied between the stationary and moveable comb assemblies 206, 218, an electrostatic force of attraction is generated to urge the movable comb assemblies 218 towards corresponding stationary comb assemblies 206, thus exerting a pulling actuation force in the direction of arrow 230 on the intermediate actuation structure 160'. A distance of movement, of the moveable comb assemblies 218 will depend upon several factors including, but not limited to, the geometry of the respective stationary and moveable fingers 210, 222 and a balancing of forces including the generation of an electrostatic actuation force (e.g., 72 of FIG. 4, which as noted above, depends on the magnitude of the applied voltage), and a restoring force (e.g., tensile force 76, and optionally spring force 74, of FIG. 4). In the case of utilizing the suspension assembly 100' including the intermediate actuation structure 160', a substantial portion of the restoring force (at least in larger displacements) is generally defined by the above-described tensile force created via the suspension assembly 100'. Thus, upon the actuation force being reduced (and/or removed), each of the moveable combs assemblies 218 generally returns to the non-actuated position by way of the spring and tensile forces brought about by the design/configuration of the suspension assembly 100'. The actuator assembly 201 can generally be operated utilizing any appropriate voltage protocol such as, but not limited to, a static (direct current) voltage and/or a cyclic (alternating current) voltage. The voltage protocol used generally will depend on whether the actuator assembly 201 is to provide a sustained actuation force or a cyclic actuation force, or a combination thereof.

Processes of making the suspension assemblies (such as 40, 100, and 100') will now be discussed. While surface micromachined microstructures, more specifically surface micromachined suspension assemblies, and processes for making the same, are disclosed herein, various surface micromachined microstructures and surface micromachining techniques are disclosed in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798, 283, issued Aug. 25, 1998, and entitled "METHOD FOR INTEGRATING MICROELECTROMECHANICAL DEVICES WITH ELECTRONIC CIRCUITRY; U.S. Pat. No. 5,804,084, issued Sep. 8, 1998, and entitled "USE OF CHEMICAL MECHANICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED, the entire disclosures of which are incorporated by reference in their entirety herein.

The term "sacrificial layer" as used herein means any layer or portion thereof of any surface micromachined microstructure that is used to fabricate the microstructure, but which does not generally exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). The term "structural layer" as used herein means any other layer or portion thereof of a surface micromachined microstructure other than a sacrificial layer and a substrate on which the microstructure is being fabricated. Exemplary materials for the structural layers described herein include doped or undoped polysilicon and doped or undoped silicon. Exemplary materials for the substrates described herein include silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

In more general terms, surface micromachining can be done with any suitable system of a substrate, sacrificial film(s) or layer(s) and structural film(s) or layer(s). Many substrate materials may be used in surface micromachining operations, although the tendency is to use silicon wafers because of their ubiquitous presence and availability. The substrate is essentially a foundation on which the microstructures are fabricated. This foundation material must be stable to the processes that are being used to define the microstructure(s) and cannot adversely affect the processing of the sacrificial/structural films that are being used to define the microstructure(s). With regard to the sacrificial and structural films, the primary differentiating factor is a selectivity difference between the sacrificial and structural films to the desired/required release etchant(s). This selectivity ratio is preferably several hundred to one or much greater, with an infinite selectivity ratio being preferred. However, the selectivity ratio may be as low as 5:1 or less. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example). Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)).

Only those portions of a surface micromachined microstructure that are relevant to the present invention will be described herein. There may and typically will be other layers that are included in a given surface micromachined microstructure, as well as in any system that includes such microstructures. For instance and in the case where the surface micromachined microstructures described herein are utilized as a component of a movable mirror microstructure in a surface micromachined optical system, a dielectric isolation layer will typically be formed directly on an upper surface of the substrate on which such a surface micromachined optical system is to be fabricated, and a structural layer will be formed directly on an upper surface of the dielectric isolation layer. This particular structural layer is typically patterned and utilized for establishing various electrical interconnections for the surface micromachined optical system, which is thereafter fabricated thereon.

A suspension assembly 300 can be formed by surface micromachining processes as described hereinafter with reference to FIGS. 15A–15P which show schematic cross-sections of the suspension system 300 at various stages in the fabrication process similar to that of what could be seen along the cross-sectional plane 15 of the suspension assembly 100 of FIG. 10A. The surface micromachining processes are based on conventional IC processing steps, including material deposition, photolithography, masking, etching, mask stripping, and cleaning. Up to hundreds of individual process steps can be used to form the completed structure of the suspension system 100 based on repeated deposition and patterning of alternating layers of structural material (e.g., polysilicon) and sacrificial material (e.g., silicon dioxide or a silicate glass), with the suspension system 100 being built up layer by layer. In a preferred process for forming the suspension system, altogether 5 layers or levels of polysilicon are used as described hereinafter (including a Poly-0 layer which generally provides electrical interconnections between the suspension assembly 100 and other components of a MEM system).

The term "patterning" as used herein refers to a sequence of well-known processing steps including applying a photoresist to the substrate, prebaking the photoresist, aligning the substrate with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising up to about 500 nanometers or more of a silicate glass deposited from the decomposition of tetraethylortho silicate (as known as TEOS) by low-pressure chemical vapor deposition at about 750° C. and densified by a high temperature processing) overlying a polysilicon or sacrificial material layer in preparation for defining features into the layer by etching.

Figure 15A:
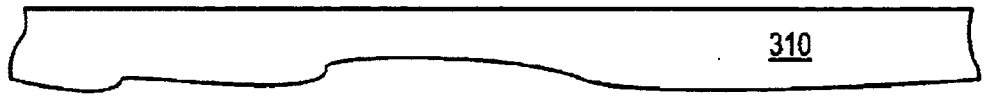
FIGS. 15A–P are sequential views of a method for making a suspension assembly.
Figure 15B:
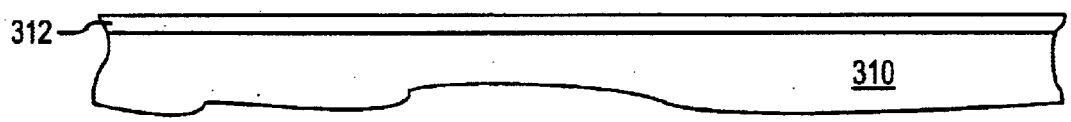
Figure 15C:
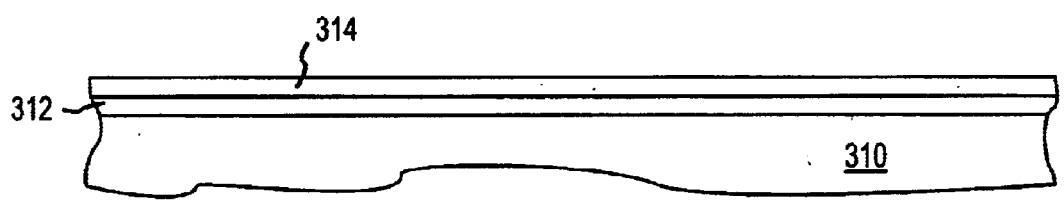
Figure 15D:
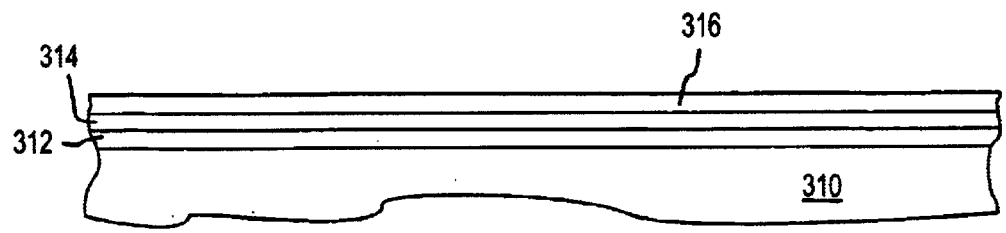

In FIG. 15A, a base substrate 310 is provided which preferably comprises silicon, and can be either a monocrystalline silicon substrate or a silicon-on-insulator substrate. In an optional step of the process, the base substrate 310 can be initially pretreated for fabrication of the suspension system 100 as shown in FIG. 15B by blanketing the base substrate 310 with a layer of thermal oxide 312 (e.g., about 630 nanometers thick) formed by a conventional wet oxidation process at an elevated temperature (e.g. 1050° C. for about 1.5 hours). FIG. 15C illustrates that a layer of low-stress silicon nitride 314 (e.g., about 800 nanometers thick) can then be deposited over the thermal oxide layer 312. The thermal oxide layer 312 and the silicon nitride layer 312, 314 (also referred to as a "dielectric layer") generally provide electrical isolation from the base substrate 310 for deposition of a first structural layer 316 (also referred to as Poly-0) as shown in FIG. 15D. In some embodiments, one or more "vias" (not shown) can be defined and etched through the thermal oxide and silicon nitride layers 312, 314 so that electrical connections between the first structural layer 316 and the base substrate 310 can be formed.

The first structural layer 316 (also referred to as Poly-0), which at least in some embodiments may be about 300 nanometers thick, is deposited atop the silicon nitride layer 314. This first structural layer 316 can then be patterned (not shown) and etched to form an electrical distribution network 202 of FIG. 13 (amongst other components such as ground planes). After deposition and patterning, the first structural layer 316 can be annealed at a high temperature (e.g. at about 1100° C. for three hours) to relieve/reduce any stress therein. Further, a separate annealing step can be performed after deposition and patterning of each subsequent structural layer.

Figure 15E:
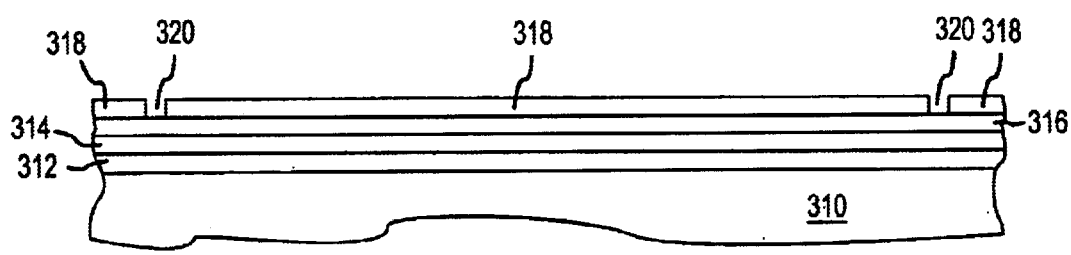

A first sacrificial layer 318 (also referred to as Sacox-1), which at least in some embodiments may be about 2 μm thick, can then be formed to cover the first structural layer 316 and subsequently patterned as shown in FIG. 15E. As mentioned previously, this first sacrificial layer 318 can be made from silicon dioxide ($SiO_2$), a silicate glass, or any other appropriate sacrificial material. In a preferred, yet optional step, after deposition, each sacrificial layer (e.g., 318) is generally planarized by an appropriate planarizing process such as chemical-mechanical polishing. This planarizing step enables the thickness of each sacrificial layer (e.g. 318) to be adjusted to a desired thickness, as well as maintains a planar topography during build up of the structure of the suspension system 300. After the planarizing step, a plurality of openings 320 can be etched through the first sacrificial layer 318 to the underlying first structural layer 316, preferably at the locations similar to that of the base anchors 112, 114, 116, 118 of the suspension assembly 100.

Figure 15F:
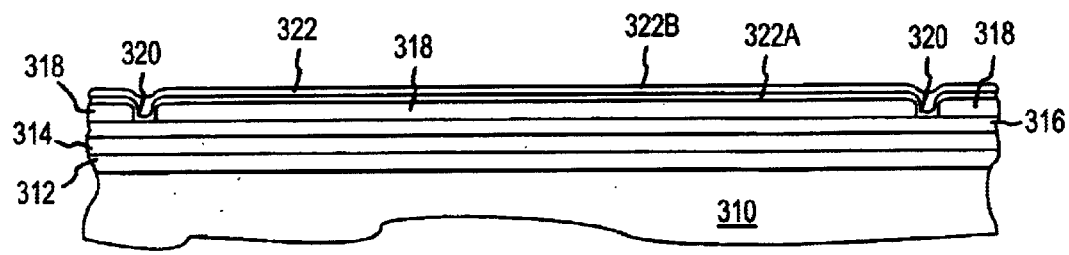
Figure 15G:
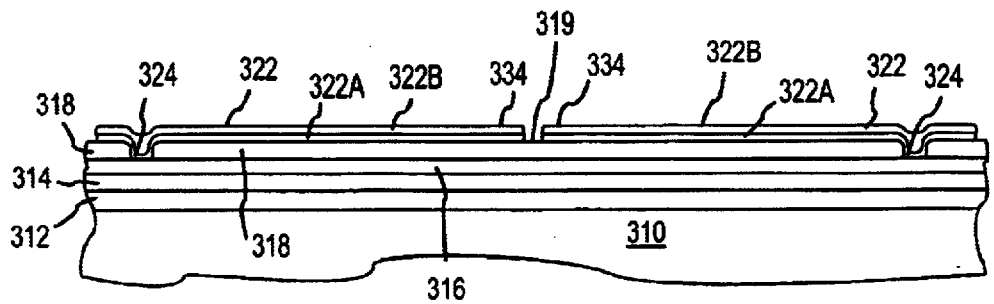

Referring to FIG. 15F, a second structural layer 322 generally made up of a plurality of layers 322A, 322B of structural material (also referred to as Poly-1 and Poly-2), which may have a combined thickness of about 2.5 μm, is formed atop the first sacrificial layer 318 to fill each opening 320 therein. In other words, the openings 320 are preferably completely occupied by this second structural layer 322 after its formation. While this second structural layer 322 is illustrated as being formed from two depositions of structural material, the variational embodiments may have a second structural layer 322 formed from a single deposition or more than two depositions of structural material. The second structural layer 322 is then patterned, as shown in FIG. 15G to form base anchors 324 such as the base anchors 112, 114, 116, 118 of FIG. 5 and the various components of the lower support structure 130 such as support arms 334 corresponding to the second and forth lower support arms 138, 142 of the lower support structure 130 of FIG. 6.

Figure 15H:
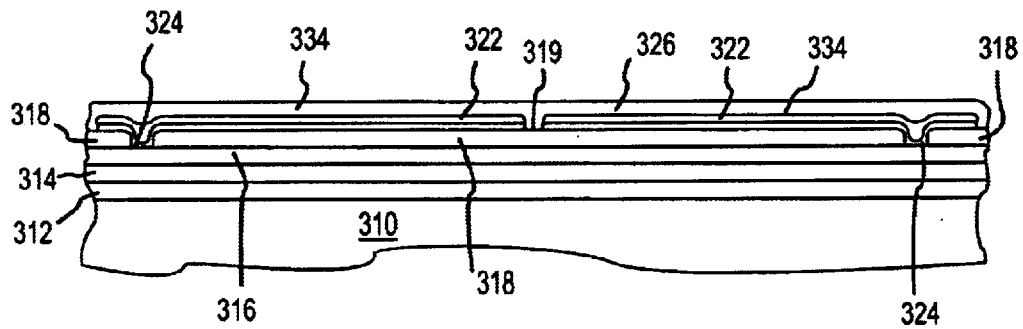
Figure 15I:
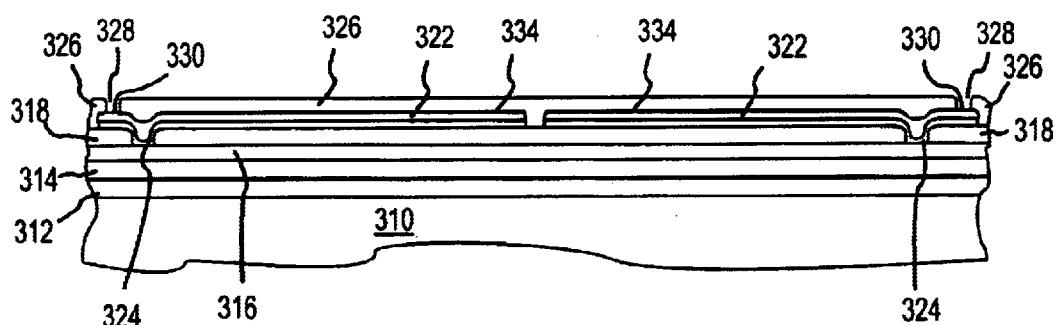

In FIG. 15H, a second sacrificial layer 326 (also referred to as Sacox-3), usually made up of the same sacrificial material as the first sacrificial layer 318, is formed over the second structural layer 322 and the exposed portions 319 of the first sacrificial layer 318. This second sacrificial layer 326 may also undergo an optional planarizing step. Referring to FIG. 15I, the second sacrificial layer 326 is generally patterned to form a plurality of receptacles 328 corresponding to locations for subsequent formation of the intermediate support anchors 156 of FIG. 7. Generally, a floor 330 of each of these receptacles 328 is at least partially defined by the second structural layer 322 (e.g., lower support arms 334) corresponding to the lower support structure 130 of FIG. 7.

Figure 15J:
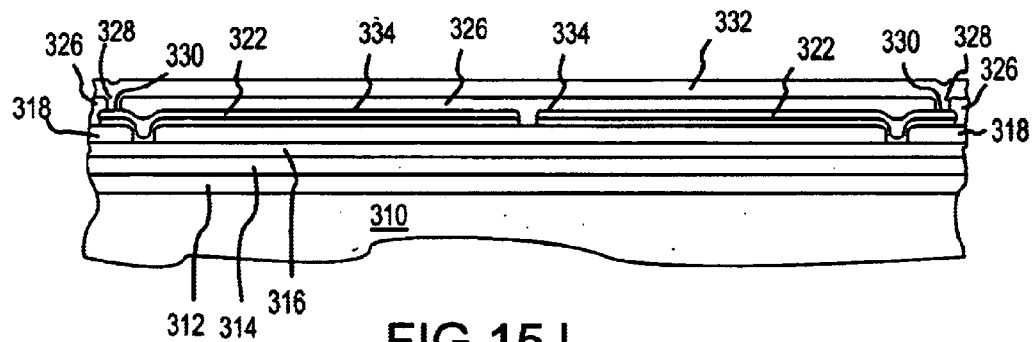
Figure 15K:
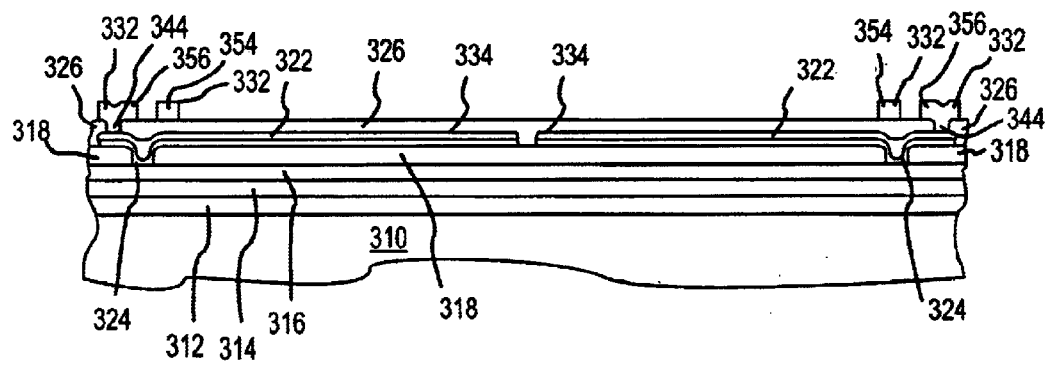

Referring to FIG. 15J, a third structural layer 332 (also referred to as Poly-3) is formed over the second sacrificial layer 326 including the entireties of the floors 330 of the receptacles 328. In other words, the structural material that makes up the third structural layer 332 substantially occupies the entireties of the receptacles 328. This third structural layer 332 is then patterned, as illustrated in FIG. 15K, to form intermediate support anchors 344 corresponding to the intermediate support anchors 156 disposed atop the lower support structure 130 shown in FIG. 7, as well as the intermediate actuation structure 160 positioned atop the intermediate support anchors 156 shown in FIGS. 8 and 11. FIG. 15K also illustrates the patterning of the third structural layer 332 by the formation of lateral rails 354 corresponding to the first and second lateral rails 162, 164 of the intermediate actuation structure 160 located atop the intermediate support anchors 156B illustrated in FIGS. 8 and 11. In addition, FIG. 15K illustrates the patterning of the third structural layer 332 by the formation of fixed end supports 356 corresponding to the second and fourth fixed end supports 168, 172 of the intermediate actuation structure 160 located atop the intermediate support anchors 156A illustrated in FIGS. 8 and 11.

Figure 15L:
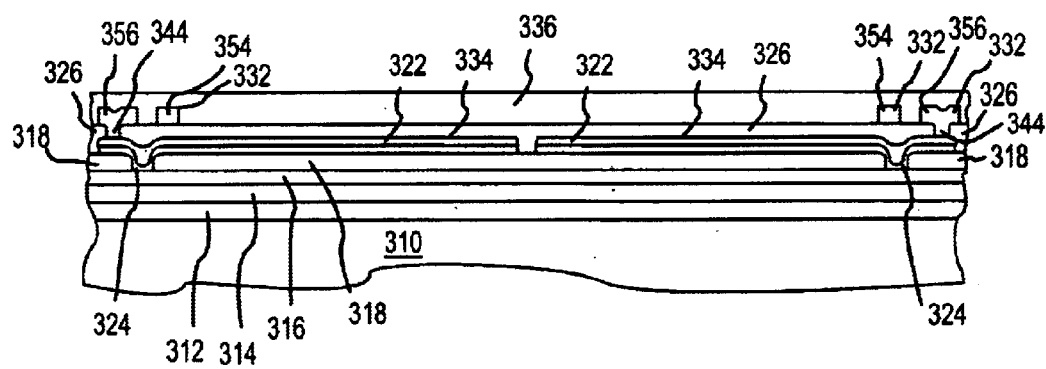
Figure 15M:
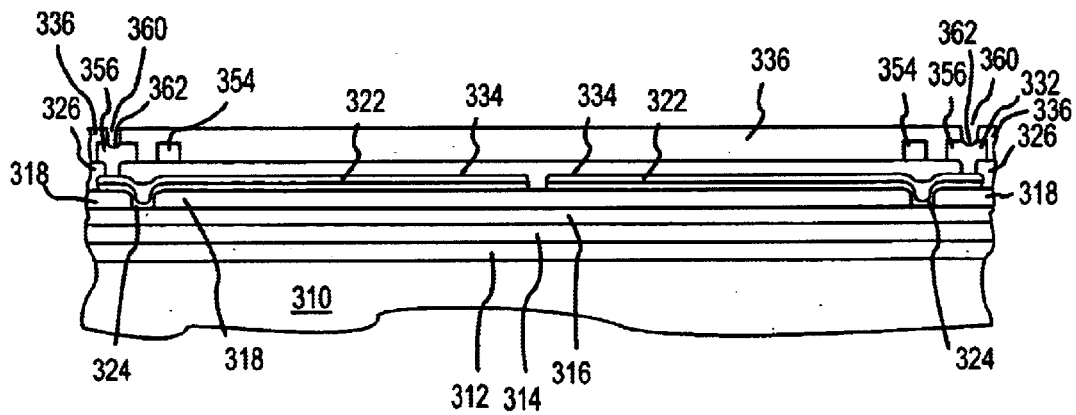

FIG. 15L illustrates a third sacrificial layer 336 (also referred to as Sacox-4), usually made up of the same sacrificial material as one or both the first and second sacrificial layers 318, 326 formed over the second sacrificial layer 326 and the remaining portions of the third structural layer 332 (e.g., lateral rails 354 and fixed end supports 356). This third sacrificial layer 336 may also undergo an optional planarizing step. Referring to FIG. 15M, the third sacrificial layer 336 is generally patterned to form a plurality of upper receptacles 360 corresponding to locations for subsequent formation of actuation support anchors 178 shown in FIGS. 9A, 11, 12. Generally, a floor 362 of each of the upper receptacles 360 is at least partially defined by the remaining portions of the third structural layer 332 (e.g., lateral rails 354 and fixed end supports 356).

Figure 15N:
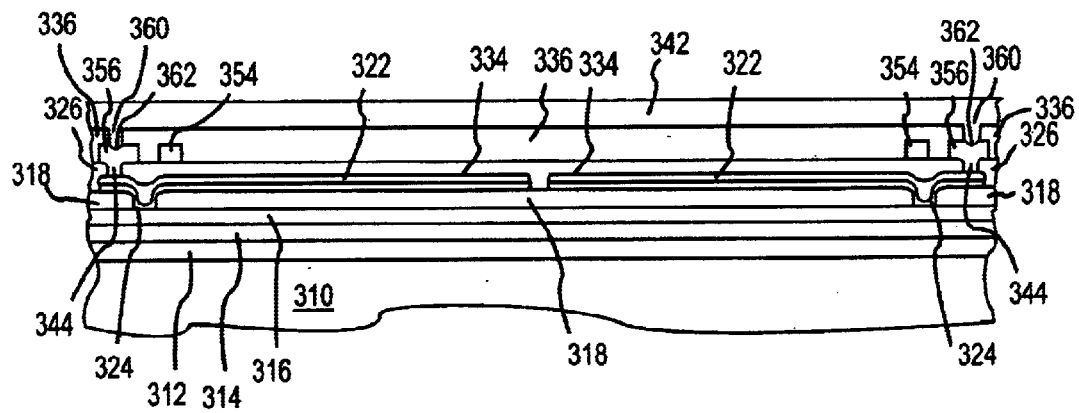
Figure 15O:
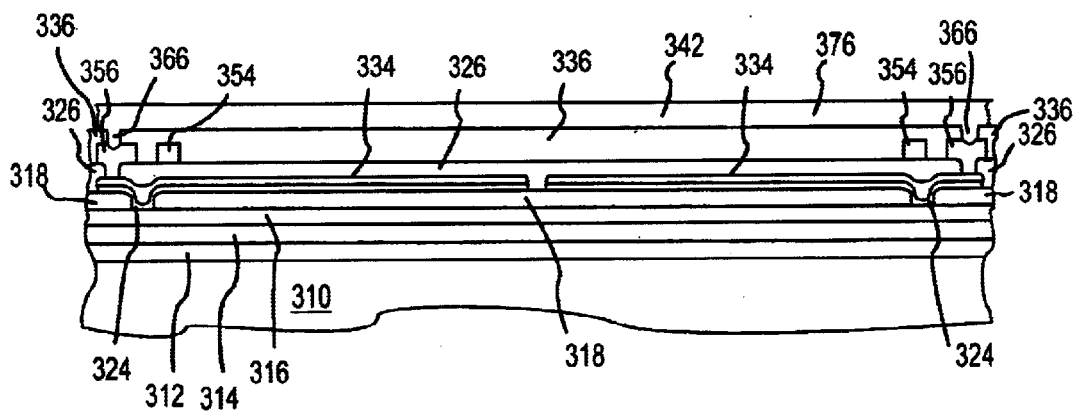

Referring to FIG. 15N, a fourth structural layer 342 (also referred to as Poly-4) is formed over the third sacrificial layer 336 including the entireties of the floors 362 of the upper receptacles 360. Accordingly, the structural material that makes up the fourth structural layer 342 substantially occupies the entireties of the upper receptacles 360. This fourth structural layer 342 is then patterned, as shown in FIG. 15O, to form actuation support anchors 366 corresponding to the actuation support anchors 178 positioned atop the intermediate actuation structure 160 shown in FIGS. 9A, 11 and 12, as well as the various components of the second support structure 180 positioned atop the actuation support anchors 178 shown in FIGS. 10A, 11 and 12. Formation of a second support structure 376 from the fourth structural layer 342 is also shown in FIG. 15O and generally corresponds to the second support structure 180 of FIGS. 10A, 11, 12.

Figure 15P:
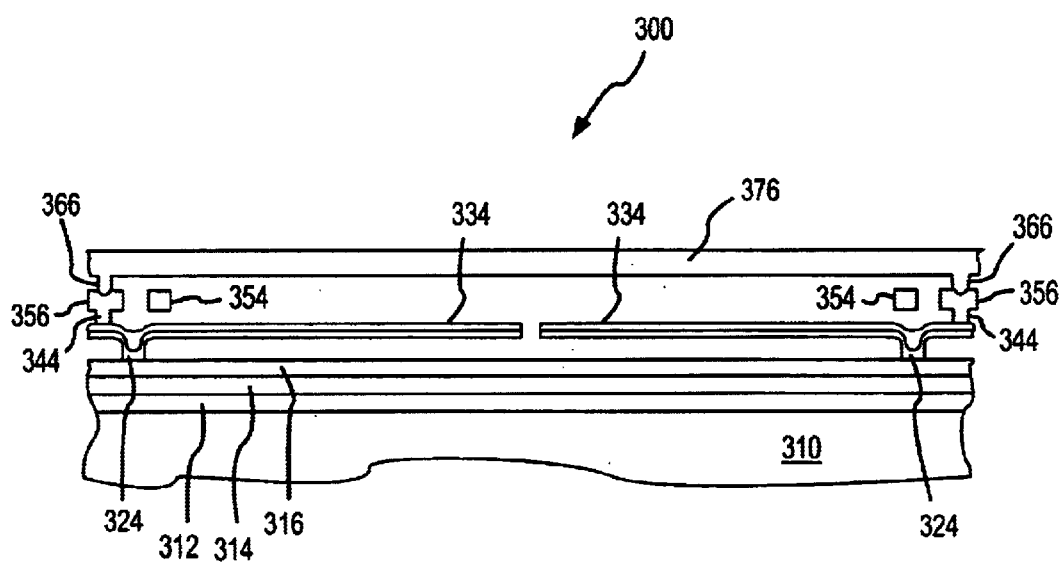

Referring to FIG. 15P, the suspension assembly 300 is then released for operation by selectively etching away the various sacrificial layers (e.g., 318, 326, 336) using an appropriate etchant that does not substantially affect the structural integrity of the various structural layers (e.g., 316, 322, 332, 342). For this purpose, a plurality of access holes (such as 181 of FIG. 10A) can be formed through one or more of the various structural layers to expose underlying portions of the corresponding sacrificial layers.

Although the process described above for fabricating the suspension assembly 300 is based on forming three sacrificial layers and five structural layers, those skilled in the art will understand that the arrangement of the individual layers (as well as the components of the corresponding layers) may be varied.

Those skilled in the art will now see that certain modifications can be made to the apparatus and methods herein disclosed with respect to the illustrated embodiments, without departing from the spirit of the instant invention. And while the invention has been described above with respect to the preferred embodiments, it will be understood that the invention is adapted to numerous rearrangements, modifications, and alterations, and all such arrangements, modifications, and alterations are intended to be within the scope of the appended claims.

What is claimed:

1. A suspension assembly for an actuator element of a microelectromechanical system, said suspension assembly being disposed on a base substrate wherein said suspensions assembly comprises:
   a support structure interconnected with said base substrate and comprising a medial support rail and a plurality of support beams extending out from first and second lateral side of said medial support rail;
   an intermediate actuation structure interconnected with said support structure and disposed between said support structure of said suspension assembly and said base substrate of said microelectromechanical system;
   a first linkage structure operatively interposed between said base substrate and said support structure; and
   a second linkage structure operatively interposed between said support structure and said intermediate actuation structure.

2. A suspension assembly, as claimed in claim 1, wherein said first linkage structure enables at least part of said support structure to move relative to said base substrate.

3. A suspension assembly, as claimed in claim 1, wherein said second linkage structure enables said intermediate actuation structure to move relative to at least one of said support structure and said base substrate.

4. A suspension assembly, as claimed in claim 1, wherein said actuator element is interconnected to said intermediate actuation structure.

5. A suspension assembly, as claimed in claim 1, wherein said actuator element is connected to said intermediate actuation structure such that said actuator element and said support structure are substantially coplanar.

6. A suspension assembly, as claimed in claim 1, wherein said actuator element comprises an electrostatic comb.

7. A suspension assembly, as claimed in claim 1, wherein said base substrate comprises a voltage reference plane.

8. A suspension assembly, as claimed in claim 1, wherein said support beams have distal ends remotely disposed from said medial support rail, and wherein distal ends of said support beams are connected to said base substrate via linkages of said first linkage structure.

9. A suspension assembly, as claimed in claim 1, wherein said first linkage structure comprises at least three layers of polysilicon.

10. A suspension assembly, as claimed in claim 1, wherein said intermediate actuation structure comprises a central actuation rail and a plurality of actuation beams extending out from said central actuation rail.

11. A suspension assembly, as claimed in claim 10, wherein said actuation beams have peripheral ends remotely disposed from said central actuation rail, and wherein peripheral ends of said actuation beams are connected to said support structure via said second linkage structure.

12. A suspension assembly, as claimed in claim 1, wherein said second linkage structure comprises at least one layer of polysilicon.

13. A suspension assembly, as claimed in claim 1, wherein said intermediate actuation structure only interconnects with said base substrate via said support structure.

14. A suspension assembly, as claimed in claim 1, wherein said intermediate actuation structure avoids direct contact with said base substrate.

15. A suspension assembly, as claimed in claim 1, wherein said intermediate actuation structure is suspended over said base substrate due to said second linkage structure connecting said intermediate actuation structure to said support structure.

16. A suspension assembly, as claimed in claim 1, wherein said intermediate actuation structure can be displaced by a first distance, and wherein said support structure is displaced by a second distance less than said first distance when said intermediate actuation structure is displaced by said first distance.

17. A suspension assembly, as claimed in claim 1, wherein said intermediate actuation structure comprises at least one linkage channel, and wherein at least a portion of said first linkage structure passes through said at least one linkage channel so as to enable said intermediate actuation structure to move without interference from said first linkage structure.

18. A suspension assembly, as claimed in claim 17, wherein said at least one linkage channel is oblong or elliptical.

19. A suspension assembly, as claimed in claim 1, wherein said intermediate actuation structure comprises first and second lateral actuation rails which are substantially parallel to a direction of movement of said intermediate actuation structure.

20. A suspension assembly, as claimed in claim 19, wherein said intermediate actuation structure comprises at least one actuation beam connecting said first lateral actuation rail to said second lateral actuation rail.

21. A suspension assembly, as claimed in claim 19, wherein said intermediate actuation structure comprises a central actuation rail disposed between said first and second lateral actuation rails.

22. A suspension assembly, as claimed in claim 21, wherein said intermediate actuation structure comprises a plurality of actuation beams connecting said first and second lateral actuation rails to said central actuation rail.

23. A suspension assembly, as claimed in claim 22, wherein at least one actuation beam of said plurality of actuation beams perpendicularly interfaces with at least one of said first lateral actuation rail, said second lateral actuation rail, and said actuation rail.

24. A suspension assembly for an actuator element of a microelectromechanical system, wherein said suspension assembly comprises:
a first support structure interconnected with a base of said microelectromechanical system;
a second support structure interconnected with said first support structure; and
an intermediate actuation structure interconnected with said actuator element and operatively interposed between and interconnected with said first support structure and said second support structure, wherein at least one of said first and second support structures comprise a longitudinal center support beam comprising elongate first and second lateral sides, and wherein said longitudinal center support beam comprises a plurality of arms connected to and extending out from said first and second lateral sides of said center support beam.

25. A suspension assembly, as claimed in claim 24, further comprising a plurality of base anchors connecting said first support structure to said base.

26. A suspension assembly, as claimed in claim 24, further comprising a plurality of support anchors disposed between and interconnecting said first support structure and said intermediate actuation structure.

27. A suspension assembly, as claimed in claim 24, further comprising a plurality of support anchors disposed between interconnecting said intermediate actuation structure and said second support structure.

28. A suspension assembly, as claimed in claim 24, wherein said first support structure comprises said center support beam, and wherein said plurality of arms comprises first, second, third, and fourth lower support arms interconnected with said center support beam and at least first and second lower flex arms interconnected with said center support beam, wherein said first and second lower support arms and said first lower flex arm are disposed on said first lateral side of said center support beam, and wherein said third and fourth lower support arms and said second lower flex arm are disposed on said second lateral side of said center support beam.

29. A suspension assembly, as claimed in claim 28, wherein said first lower flex arm is disposed between said first and second lower support arms.

30. A suspension assembly, as claimed in claim 28, wherein said second lower flex arm is disposed between said third and fourth lower arms.

31. A suspension assembly, as claimed in claim 28, wherein said first lower flex arm is substantially aligned with said first and second lower support arms, and wherein said second lower flex arm is substantially aligned with said third and fourth lower support arms.

32. A suspension assembly, as claimed in claim 28, wherein first, second, third, and fourth fixed ends of respective said first, second, third, and fourth lower support arms are remotely disposed from said center support beam.

33. A suspension assembly, as claimed in claim 32, wherein first, second, third, and fourth fixed ends of respective said first, second, third, and fourth lower support arms are interconnected with said base.

34. A suspension assembly, as claimed in claim 28, wherein an entirety of each of said first and second lower flex arms is separated from and avoids direct conflict with said base so that said first and second lower flex arms are substantially unimpeded by any interconnection of said first and second lower flex arms to said base.

35. A suspension assembly, as claimed in claim 28, wherein first and second free ends of respective said first and second lower flex arms are remotely disposed from said center support beam.

36. A suspension assembly, as claimed in claim 28, wherein first and second free ends of respective said first and second lower flex arms are separated from and avoids direct contact with said base.

37. A suspension assembly, as claimed in claim 28, further comprising a plurality of base anchors connecting first, second, third, and fourth fixed ends of respective said first, second, third, and fourth lower support arms of said first support structure to said base.

38. A suspension assembly, as claimed in claim 28, further comprising third and fourth lower flex arms interconnected with said center support beam.

39. A suspension assembly, as claimed in claim 38, wherein third and fourth free ends of respective said third and fourth lower flex arms are remotely disposed from said center support beam.

40. A suspension assembly, as claimed in claim 38, wherein third and fourth free ends of respective said third and fourth lower flex arms are separated from said base.

41. A suspension assembly, as claimed in claim 24, wherein said intermediate actuation structure comprises a central actuator beam interconnected with displacement multiplier.

42. A suspension assembly, as claimed in claim 24, wherein said intermediate actuator structure comprises a central actuator beam interconnected with an elevator assembly for positioning a microstructure.

43. A suspension assembly, as claimed in claim 24, wherein said intermediate actuator structure comprises a central actuator beam parallel to and vertically spaced from said center support beam.

44. A suspension assembly, as claimed in claim 43, wherein said central actuator beam comprises laterally extending actuator arms.

45. A suspension assembly, as claimed in claim 44, wherein said actuator element is connected to at least one of said laterally extending actuator arms.

46. A suspension assembly, as claimed in claim 24, wherein said second support structure comprises said center support beam, and wherein said plurality of arms comprises first, second, third, and fourth upper support arms interconnected with said center support beam and at least first and second upper flex arms interconnected with said center support beam wherein said first and second upper support arms and said first upper flex arm are disposed on said first lateral side of said center support beam, and wherein said third and fourth upper support arms and said second upper flex arm are disposed on said second lateral side of said center support beam.

47. A suspension assembly, as claimed in claim 46, wherein said first upper flex arm is disposed between said first and second upper support arm.

48. A suspension assembly, as claimed in claim 46, wherein said second upper flex arm is disposed between said third and fourth upper support arms.

49. A suspension assembly, as claimed in claim 46, wherein said first upper flex arm is substantially aligned with said first and second upper support arms, and wherein said second upper flex arm is substantially aligned with said third and fourth upper support arms.

50. A suspension assembly, as claimed in claim 46, wherein first, second, third, and fourth fixed ends of respective said first, second, third, and fourth upper support arms are remotely disposed from said center support beam.

51. A suspension assembly, as claimed in claim 50, wherein first, second, third, and fourth fixed ends of respective said first, second, third, and fourth upper support arms are interconnected with said first support structure.

52. A suspension assembly, as claimed in claim 51, wherein an entirety of each of said first and second upper flex arms is separated from and avoids direct contact with said base so that said first and second upper flex arms are substantially unimpeded by any interconnection of said first and second upper flex arms to said base.

53. A suspension assembly, as claimed in claim 46, wherein first and second free ends of respective said first and second upper flex arms are remotely disposed from said center support beam.

54. A suspension assembly, as claimed in claim 46, wherein first and second free ends of respective said first and second upper flex arms are separated from and avoid direct contact with said base.

55. A suspension assembly, as claimed in claim 46, further comprising a plurality of upper support anchors interconnecting first, second, third, and fourth fixed ends of respective said first, second, third, and fourth upper support arms of said second support structure to said first support structure.

56. A suspension assembly, as claimed in claim 46, further comprising third and fourth upper flex arms interconnected with said center support beam.

57. A suspension assembly, as claimed in claim 56, wherein third and fourth free ends of respective said third and fourth upper flex arms are remotely disposed from said center support beam.

58. A suspension assembly, as claimed in claim 56, wherein third and fourth free ends of respective said third and fourth upper flex arms are separated from said base.

59. A suspension assembly, as claimed in claim 24, wherein at least portions of said second support structure are substantially parallel to and vertically spaced from said first support structure.

60. A suspension assembly, as claimed in claim 24, wherein only one of said first and second support structures comprises first and second center support rails, wherein said first and second center support rails are substantially parallel to and vertically spaced from said center support beam.

61. A suspension assembly, as claimed in claim 60, wherein said first center support rail is laterally spaced from and substantially parallel to said second center support rail.

62. A suspension assembly, as claimed in claim 24, wherein each of said first and second support structures comprise a center support beam.

63. A suspension assembly, as claimed in claim 62, wherein said first support structure comprises a first plurality of arms, wherein said second support structure comprises a second plurality of arms, and wherein said first plurality of arms is vertically spaced from and substantially parallel to said second plurality of arms.

64. A suspension assembly, as claimed in claim 24, wherein said suspension assembly is made from a structural material comprising a tensile strength of at least about 0.25 GPa.

65. A suspension assembly, as claimed in claim 24, wherein said base is a silicon wafer.

66. A suspension assembly, as claimed in claim 24, wherein said base comprises a voltage reference plane.

67. A suspension assembly, as claimed in claim 24, wherein at least one of said first support structure, said intermediate actuation structure, and said second support structure is formed from polysilicon.

68. A suspension assembly, as claimed in claim 24, wherein said actuator element comprises an electrostatic comb.

69. A suspension assembly for at least assisting in supporting a first actuation element of a microelectromechanical system and allowing movement of said first actuation element of a microelectromechanical system relative to a base substrate, wherein said suspension assembly comprises:
   a longitudinal support beam comprising elongate first and second lateral sides; and
   a plurality of first lateral beams extending out from said first and second lateral sides of said support beam, wherein at least a first one of said first lateral beams is anchored to said base substrate; and at least a second one of said first lateral beams is vertically spaced from and devoid of any direct anchoring to said base substrate.

70. A suspension assembly, as claimed in claim 69, wherein said first lateral beams are oriented in a substantially perpendicular relationship with respect to said support beam.

71. A suspension assembly, as claimed in claim 69, wherein said first one of said first lateral beams comprises a fixed end disposed remote from said support beam, wherein said fixed end is anchored to said base substrate.

72. A suspension assembly, as claimed in claim 69, wherein multiple ones of said plurality of said first lateral beams are anchored to said base substrate.

73. A suspension assembly, as claimed in claim 72, wherein said multiple ones of said first lateral beams comprise fixed ends disposed remote from said support beam, and wherein said fixed ends are anchored to said base substrate.

74. A suspension assembly, as claimed in claim 72, further comprising a plurality of second lateral beams.

75. A suspension assembly, as claimed in claim 74, wherein said second lateral beams are oriented in a substantially perpendicular relationship with respect to said support beam.

76. A suspension assembly, as claimed in claim 74, wherein said second lateral beams are oriented in substantially parallel relationship with respect to said first lateral beams.

77. A suspension assembly for at least assisting in supporting a first actuation element of a microelectromechanical system and allowing movement of said first actuation element of a microelectromechanical system relative to a base substrate, wherein said suspension assembly comprises:
   a longitudinal support beam comprising elongate first and second lateral sides;

a plurality of first lateral beams extending out from said first and second lateral sides of said support beam, wherein at least a first one of said first lateral beams is anchored to said base substrate; and a plurality of second lateral beams, each of said second lateral beams having a free end, wherein said free end of each of said second lateral beams is vertically spaced from and devoid of any anchoring to said base substrate.

78. A suspension assembly for at least assisting in supporting a first actuation element of a microelectromechanical system and allowing movement of said first actuation element of a microelectromechanical system relative to a base substrate, wherein said suspension assembly comprises:

a longitudinal support beam comprising elongate first and second lateral sides;

a plurality of first lateral beams extending out from said first and second lateral sides of said support beam, wherein at least a first one of said first lateral beams is anchored to said base substrate; and an actuation assembly including a plurality of actuation beams oriented substantially parallel to said support beam and interconnected with ones of said plurality of said plurality of first lateral beams.

79. A suspension assembly, as claimed in claim 78, wherein said actuation assembly is vertically displaced from said support beam.

80. A suspension assembly, as claimed in claim 78, wherein said first actuation element is interconnected to at least one of said actuation beams.

81. A suspension assembly, as claimed in claim 78, wherein said actuation assembly comprises a plurality of second lateral beams oriented substantially perpendicular to said plurality of said actuation beams and extending between and interconnecting at least ones of said plurality of said actuation beams.

82. A suspension assembly, as claimed in claim 81, wherein said first actuation element is interconnected to at least one of said plurality of said second lateral beams.

83. A suspension assembly, as claimed in claim 78, further comprising a support assembly, wherein said support assembly comprises a first central beam and a second central beam adjacent to said first central beam and a plurality of third and fourth lateral beams extending out from said first and second central beams.

84. A suspension assembly, as claimed in claim 83, wherein said plurality of said third lateral beams are interconnected with said plurality of said first lateral beams.

85. A suspension assembly, as claimed in claim 83, wherein said plurality of said fourth lateral beams are interconnected with said plurality of said first lateral beams.

86. A suspension assembly, as claimed in claim 85, wherein said plurality of said actuation beams of said actuation assembly are disposed between and interconnected with said plurality of said first lateral beams and said plurality of said fourth lateral beams.

* * * * *

UNITED STATES PATENT AND TRADEMARK OFFICE
CERTIFICATE OF CORRECTION

PATENT NO. : 6,707,176 B1
DATED : March 16, 2004
INVENTOR(S) : Rodgers

It is certified that error appears in the above-identified patent and that said Letters Patent is hereby corrected as shown below:

Column 33,
Line 59, delete the word "side", and insert therefor -- sides --.

Column 35,
Line 20, after the word "said", insert -- central --;
Line 67, after the word "lower", insert -- support --.

Column 36,
Line 16, delete the word "conflict", and insert therefor -- contact --;
Line 67, after the word "beam", insert -- , --.

Column 37,
Line 8, delete the word "arm", and insert therefor -- arms --.

Column 38,
Line 32, delete ";".

Signed and Sealed this

Fifteenth Day of March, 2005

JON W. DUDAS
*Director of the United States Patent and Trademark Office*